(12) United States Patent
Ko

(10) Patent No.: US 12,300,667 B2
(45) Date of Patent: May 13, 2025

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: YeongBeom Ko, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 17/692,693

(22) Filed: Mar. 11, 2022

(65) Prior Publication Data

US 2023/0018676 A1    Jan. 19, 2023

(30) Foreign Application Priority Data

Jul. 13, 2021  (KR) .................. 10-2021-0091446

(51) Int. Cl.
| | |
|---|---|
| *H01L 25/065* | (2023.01) |
| *H01L 23/00* | (2006.01) |
| *H01L 25/00* | (2006.01) |
| *H01L 25/18* | (2023.01) |

(52) U.S. Cl.
CPC .......... *H01L 25/0657* (2013.01); *H01L 24/32* (2013.01); *H01L 25/0652* (2013.01); *H01L 25/18* (2013.01); *H01L 25/50* (2013.01); *H01L 24/05* (2013.01); *H01L 24/06* (2013.01); *H01L 24/17* (2013.01); *H01L 24/73* (2013.01); *H01L 24/81* (2013.01); *H01L 24/83* (2013.01); *H01L 24/91* (2013.01); *H01L 2224/0557* (2013.01); *H01L 2224/06181* (2013.01); *H01L 2224/17181* (2013.01); *H01L 2224/32145* (2013.01); *H01L 2224/73104* (2013.01); *H01L 2224/81203* (2013.01); *H01L 2224/83203* (2013.01); *H01L 2225/06513* (2013.01); *H01L 2225/06541* (2013.01); *H01L 2225/06582* (2013.01)

(58) Field of Classification Search
None
See application file for complete search history.

(56) References Cited

U.S. PATENT DOCUMENTS

| | | | |
|---|---|---|---|
| 8,212,340 B2 | 7/2012 | Liao | |
| 9,425,177 B2 | 8/2016 | Koyanagi et al. | |
| 9,543,276 B2* | 1/2017 | Jee | ...................... H01L 23/3135 |
| 10,635,535 B2 | 4/2020 | Cha et al. | |
| 10,847,473 B2* | 11/2020 | Ko | ......................... H01L 23/552 |
| 10,950,579 B2 | 3/2021 | Chen et al. | |

(Continued)

*Primary Examiner* — Long Pham
(74) *Attorney, Agent, or Firm* — Sughrue Mion, PLLC

(57) ABSTRACT

Provided is a semiconductor package, including a lower semiconductor chip, a plurality of semiconductor chips that are disposed on the lower semiconductor chip in a first direction perpendicular to a top surface of the lower semiconductor chip, a plurality of nonconductive layers disposed between the plurality of semiconductor chips, a nonconductive pattern that extends from the nonconductive layers and is disposed on lateral surfaces of at least one of the plurality of semiconductor chips, a first mold layer disposed a top surface of the nonconductive pattern, and a second mold layer disposed a lateral surface of the nonconductive pattern and a lateral surface of the first mold layer, wherein the nonconductive pattern and the first mold layer are disposed between the second mold layer and lateral surfaces of the plurality of semiconductor chips.

19 Claims, 15 Drawing Sheets

(56) References Cited

U.S. PATENT DOCUMENTS

2012/0264257 A1 10/2012 Lee et al.
2013/0032947 A1* 2/2013 Park ..................... H01L 23/544
 257/777
2021/0082837 A1 3/2021 Huang et al.

* cited by examiner

SEMICONDUCTOR PACKAGE AND METHOD OF FABRICATING THE SAME

CROSS-REFERENCE TO RELATED APPLICATION

This U.S. nonprovisional application claims priority to Korean Patent Application No. 10-2021-0091446 filed on Jul. 13, 2021 in the Korean Intellectual Property Office, the disclosure of which is hereby incorporated by reference in its entirety.

BACKGROUND

Example embodiments of the present disclosure relate to a semiconductor package and a method of fabricating the same, and more particularly, to a semiconductor package in which a plurality of semiconductor chips are mounted and a method of fabricating the same.

A semiconductor package is provided to implement an integrated circuit chip to qualify for use in electronic products. In the semiconductor package, a semiconductor chip is mounted on a printed circuit board (PCB) and bonding wires or bumps are used to electrically connect the semiconductor chip to the printed circuit board. With the development of the electronic industry, there is a demand for smaller, lighter, and multifunctional electronic devices, and therefore there is suggested a multi-chip package in which a plurality of chips are stacked in a single semiconductor package or a system-in-package which has different kinds of chips mounted in a single semiconductor package and which operates as one system.

SUMMARY

One or more embodiments provide a semiconductor package having excellent reliability and a method of fabricating the same.

According to an aspect of an example embodiment, there is provided a semiconductor package, including a lower semiconductor chip, a plurality of semiconductor chips stacked on the lower semiconductor chip in a first direction perpendicular to a top surface of the lower semiconductor chip, a plurality of nonconductive layers between the plurality of semiconductor chips, a nonconductive pattern that extends from the nonconductive layers and is on lateral surfaces of at least one of the plurality of semiconductor chips, a first mold layer on a top surface of the nonconductive pattern, and a second mold layer on a lateral surface of the nonconductive pattern and a lateral surface of the first mold layer, wherein the nonconductive pattern and the first mold layer are between the second mold layer and lateral surfaces of the plurality of semiconductor chips.

According to another aspect of an example embodiment, there is provided a semiconductor package, including a lower semiconductor chip, a plurality of semiconductor chips that are stacked on the lower semiconductor chip in a first direction perpendicular to a top surface of the lower semiconductor chip, a plurality of bumps between the plurality of semiconductor chips and connecting the plurality of semiconductor chips to each other, a plurality of nonconductive layers between the plurality of semiconductor chips, each of the plurality of nonconductive layers being between corresponding ones of the plurality of bumps and between neighboring ones of the plurality of semiconductor chips, a nonconductive pattern that extends from the nonconductive layers and is on lateral surfaces of at least one of the plurality of semiconductor chips, a first mold layer on a top surface of the nonconductive pattern, and a second mold layer on a lateral surface of the nonconductive pattern and a lateral surface of the first mold layer, wherein the nonconductive pattern and the first mold layer are between the second mold layer and lateral surfaces of the plurality of semiconductor chips, wherein each of the plurality of semiconductor chips includes a plurality of through electrodes, and wherein the plurality of semiconductor chips are connected to each other through the plurality of through electrodes and the plurality of bumps.

According to another aspect of an example embodiment, there is provided a method of fabricating a semiconductor package, the method including providing a lower substrate including a plurality of lower semiconductor chips, mounting a plurality of first chip stacks on a plurality of lower semiconductor chips, respectively, forming, on the lower substrate, a first mold layer that is formed on the plurality of first chip stacks, forming a plurality of openings that penetrate the first mold layer between the plurality of first chip stacks, forming a second mold layer that fills the plurality of openings, and forming a plurality of second chip stacks by cutting the second mold layer between the plurality of first chip stacks, wherein each of the plurality of first chip stacks includes a plurality of semiconductor chips that are vertically stacked, and a nonconductive pattern disposed on a lateral surface of at least one of the plurality of semiconductor chips, wherein each of the plurality of openings exposes a lateral surface of the nonconductive pattern of each of the plurality of first chip stacks, and wherein the second mold layer is disposed on the exposed lateral surface of the nonconductive pattern of each of the plurality of first chip stacks.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION OF EMBODIMENTS

The following will now describe in detail example embodiments with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to"

or "directly coupled to" another element or layer, there are no intervening elements or layers present.

Figure 1:
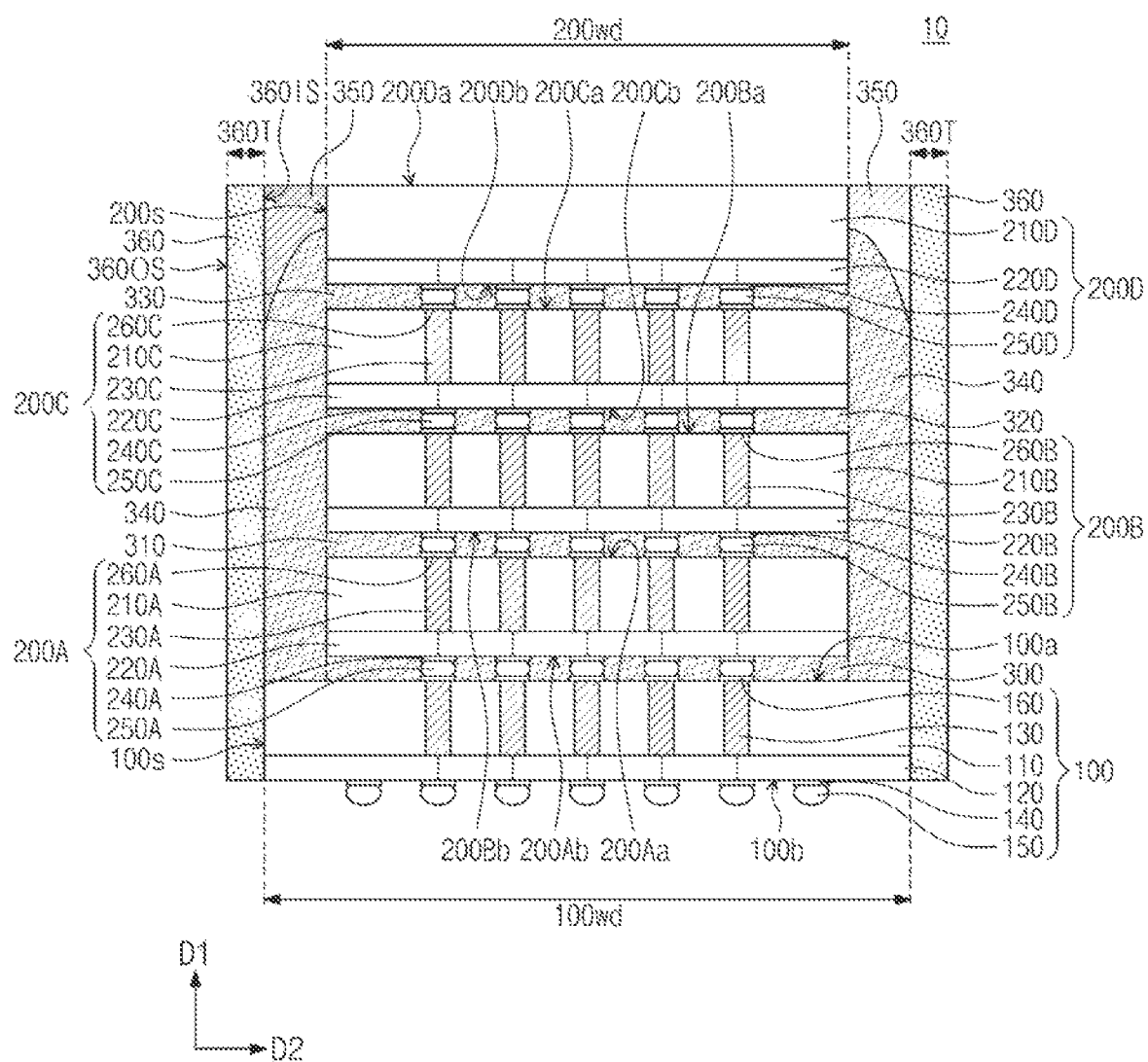
FIGS. 1, 2, and 3 illustrate cross-sectional views showing a semiconductor package according to example embodiments.

FIG. 1 illustrates a cross-sectional view showing a semiconductor package according to example embodiments.

Referring to FIG. 1, a semiconductor package 10 may include a lower semiconductor chip 100 and a plurality of semiconductor chips 200A, 200B, 200C, and 200D that are vertically stacked on the lower semiconductor chip 100. The lower semiconductor chip 100 may have a top surface 100a and a bottom surface 100b that are opposite to each other. The plurality of semiconductor chips 200A, 200B, 200C, and 200D may be disposed on the top surface 100a of the lower semiconductor chip 100 and may be stacked on the lower semiconductor chip 100 along a first direction D1 perpendicular to the top surface 100a of the lower semiconductor chip 100. As an example, FIG. 1 illustrates a structure in which four semiconductor chips 200A, 200B, 200C, and 200D are stacked on the lower semiconductor chip 100 sequentially along the first direction D1, but embodiments are not limited thereto.

The lower semiconductor chip 100 may include a lower semiconductor substrate 110, a lower circuit layer 120, lower through electrodes 130, first lower chip pads 140, second lower chip pads 160, and lower bumps 150. The lower semiconductor substrate 110 may be one or more of a silicon substrate, a germanium substrate, and a silicon-germanium substrate. The lower circuit layer 120 may include integrated circuits formed on the lower semiconductor substrate 110. For example, the lower circuit layer 120 may be adjacent to the bottom surface 100b of the lower semiconductor chip 100.

The lower through electrodes 130 may penetrate the lower semiconductor substrate 110 and may be horizontally spaced apart from each other in the lower semiconductor substrate 110. The lower through electrodes 130 may be spaced apart from each other along a second direction D2 parallel to the top surface 100a of the lower semiconductor chip 100. The lower through electrodes 130 may be electrically connected to the lower circuit layer 120. The lower through electrodes 130 may include metal (e.g., copper, tungsten, titanium, or tantalum).

The first lower chip pads 140 may be disposed on the bottom surface 100b of the lower semiconductor chip 100 and may be electrically connected to the lower circuit layer 120. The lower bumps 150 may correspondingly be disposed on and connected to the first lower chip pads 140. The lower bumps 150 may be connected to external terminals. The second lower chip pads 160 may be disposed on the top surface 100a of the lower semiconductor chip 100 and may be correspondingly connected to the lower through electrodes 130. The first lower chip pads 140 and the second lower chip pads 160 may include metal (e.g., copper). The lower bumps 150 may include a conductive material and may have at least one selected from solder-ball shapes, bump shapes, and pillar shapes.

The plurality of semiconductor chips 200A, 200B, 200C, and 200D may include a first semiconductor chip 200A, a second semiconductor chip 200B, a third semiconductor chip 200C, and a fourth semiconductor chip 200D that are sequentially stacked on the top surface 100a of the lower semiconductor chip 100.

The first semiconductor chip 200A may include a first semiconductor substrate 210A, a first circuit layer 220A, first through electrodes 230A, first chip pads 240A, second chip pads 260A, and first bumps 250A. The first semiconductor substrate 210A may be one or more of a silicon substrate, a germanium substrate, and a silicon-germanium substrate. The first circuit layer 220A may include integrated circuits formed on the first semiconductor substrate 210A. The first semiconductor chip 200A may have a top surface 200Aa and a bottom surface 200Ab that are opposite to each other, and for example, the first circuit layer 220A may be adjacent to the bottom surface 200Ab of the first semiconductor chip 200A.

The first through electrodes 230A may penetrate the first semiconductor substrate 210A and may be horizontally spaced apart from each other in the first semiconductor substrate 210A. The first through electrodes 230A may be spaced apart from each other along the second direction D2 and may be electrically connected to the first circuit layer 220A. The first through electrodes 230A may include metal (e.g., copper, tungsten, titanium, or tantalum).

The first chip pads 240A may be disposed on the bottom surface 200Ab of the first semiconductor chip 200A and may be electrically connected to the first circuit layer 220A. The first bumps 250A may correspondingly be disposed on and connected to the first chip pads 240A. The first bumps 250A may be correspondingly connected to the second lower chip pads 160 of the lower semiconductor chip 100. The first semiconductor chip 200A may be electrically connected to the lower semiconductor chip 100 through the first chip pads 240A and the first bumps 250A. The second chip pads 260A may be disposed on the top surface 200Aa of the first semiconductor chip 200A and may be correspondingly connected to the first through electrodes 230A. The first chip pads 240A and the second chip pads 260A may include metal (e.g., copper). The first bumps 250A may include a conductive material and may have at least one of solder-ball shapes, bump shapes, and pillar shapes.

The second semiconductor chip 200B may include a second semiconductor substrate 210B, a second circuit layer 220B, second through electrodes 230B, third chip pads 240B, fourth chip pads 260B, and second bumps 250B. The second semiconductor substrate 210B may be one or more of a silicon substrate, a germanium substrate, and a silicon-germanium substrate. The second circuit layer 220B may include integrated circuits formed on the second semiconductor substrate 210B. The second semiconductor chip 200B may have a top surface 200Ba and a bottom surface 200Bb that are opposite to each other, and for example, the second circuit layer 220B may be adjacent to the bottom surface 200Bb of the second semiconductor chip 200B.

The second through electrodes 230B may penetrate the second semiconductor substrate 210B and may be horizontally spaced apart from each other in the second semiconductor substrate 210B. The second through electrodes 230B may be spaced apart from each other along the second direction D2 and may be electrically connected to the second circuit layer 220B. The second through electrodes 230B may include metal (e.g., copper, tungsten, titanium, or tantalum).

The third chip pads 240B may be disposed on the bottom surface 200Bb of the second semiconductor chip 200B and may be electrically connected to the second circuit layer 220B. The second bumps 250B may correspondingly be disposed on and connected to the third chip pads 240B. The second bumps 250B may be correspondingly connected to the second chip pads 260A of the first semiconductor chip 200A. The second semiconductor chip 200B may be electrically connected to the first semiconductor chip 200A through the third chip pads 240B and the second bumps 250B. The fourth chip pads 260B may be disposed on the top surface 200Ba of the second semiconductor chip 200B and may be correspondingly connected to the second through electrodes 230B. The third chip pads 240B and the fourth chip pads 260B may include metal (e.g., copper). The second bumps 250B may include a conductive material and may have at least one of solder-ball shapes, bump shapes, and pillar shapes.

The third semiconductor chip 200C may include a third semiconductor substrate 210C, a third circuit layer 220C, third through electrodes 230C, fifth chip pads 240C, sixth chip pads 260C, and third bumps 250C. The third semiconductor substrate 210C may be one or more of a silicon substrate, a germanium substrate, and a silicon-germanium substrate. The third circuit layer 220C may include integrated circuits formed on the third semiconductor substrate 210C. The third semiconductor chip 200C may have a top surface 200Ca and a bottom surface 200Cb that are opposite to each other, and for example, the third circuit layer 220C may be adjacent to the bottom surface 200Cb of the third semiconductor chip 200C.

The third through electrodes 230C may penetrate the third semiconductor substrate 210C and may be horizontally spaced apart from each other in the third semiconductor substrate 210C. The third through electrodes 230C may be spaced apart from each other along the second direction D2 and may be electrically connected to the third circuit layer 220C. The third through electrodes 230C may include metal (e.g., copper, tungsten, titanium, or tantalum).

The fifth chip pads 240C may be disposed on the bottom surface 200Cb of the third semiconductor chip 200C and may be electrically connected to the third circuit layer 220C. The third bumps 250C may correspondingly be disposed on and connected to the fifth chip pads 240C. The third bumps 250C may be correspondingly connected to the fourth chip pads 260B of the second semiconductor chip 200B. The third semiconductor chip 200C may be electrically connected to the second semiconductor chip 200B through the fifth chip pads 240C and the third bumps 250C. The sixth chip pads 260C may be disposed on the top surface 200Ca of the third semiconductor chip 200C and may be correspondingly connected to the third through electrodes 230C. The fifth chip pads 240C and the sixth chip pads 260C may include metal (e.g., copper). The third bumps 250C may include a conductive material and may have at least one of solder-ball shapes, bump shapes, and pillar shapes.

The fourth semiconductor chip 200D may include a fourth semiconductor substrate 210D, a fourth circuit layer 220D, seventh chip pads 240D, and fourth bumps 250D. The fourth semiconductor chip 200D may be an uppermost semiconductor chip of the plurality of semiconductor chips 200A, 200B, 200C, and 200D, and in this case, the fourth semiconductor chip 200D may not include through electrodes that penetrate the fourth semiconductor substrate 210D. The fourth semiconductor substrate 210D may be one or more of a silicon substrate, a germanium substrate, and a silicon-germanium substrate. The fourth circuit layer 220D may include integrated circuits formed on the fourth semiconductor substrate 210D. The fourth semiconductor chip 200D may have a top surface 200Da and a bottom surface 200Db that are opposite to each other, and for example, the fourth circuit layer 220D may be adjacent to the bottom surface 200Db of the fourth semiconductor chip 200D.

The seventh chip pads 240D may be disposed on the bottom surface 200Db of the fourth semiconductor chip 200D and may be electrically connected to the fourth circuit layer 220D. The fourth bumps 250D may correspondingly be disposed on and connected to the seventh chip pads 240D. The fourth bumps 250D may be correspondingly connected to the sixth chip pads 260C of the third semiconductor chip 200C. The fourth semiconductor chip 200D may be electrically connected to the third semiconductor chip 200C through the seventh chip pads 240D and the fourth bumps 250D. The seventh chip pads 240D may include metal (e.g., copper). The fourth bumps 250D may include a conductive material and may have at least one of solder-ball shapes, bump shapes, and pillar shapes.

The plurality of semiconductor chips 200A, 200B, 200C, and 200D may be memory chips. The plurality of semiconductor chips 200A, 200B, 200C, and 200D may be the same type of semiconductor chips, for example, the same memory chips. The lower semiconductor chip 100 may be a memory chip, a logic chip, an application processor (AP) chip, or a system-on-chip (SOC). The plurality of semiconductor chips 200A, 200B, 200C, and 200D and the lower semiconductor chip 100 may be electrically connected to each other to form a high bandwidth memory (HBM) chip. The plurality of semiconductor chips 200A, 200B, 200C, and 200D and the lower semiconductor chip 100 may each have a width in the second direction D2. According to embodiments, the lower semiconductor chip 100 may have a width 100wd greater than a width 200wd of each of the plurality of semiconductor chips 200A, 200B, 200C, and 200D.

The semiconductor package 10 may further include nonconductive layers 300, 310, 320, and 330 that are interposed between the lower semiconductor chip 100 and a lowermost one (or the first semiconductor chip 200A) of the plurality of semiconductor chips 200A, 200B, 200C, and 200D and between the plurality of semiconductor chips 200A, 200B, 200C, and 200D.

The nonconductive layers 300, 310, 320, and 330 may include a first nonconductive layer 300 between the lower semiconductor chip 100 and the first semiconductor chip 200A, a second nonconductive layer 310 between the first semiconductor chip 200A and the second semiconductor chip 200B, a third nonconductive layer 320 between the second semiconductor chip 200B and the third semiconductor chip 200C, and a fourth nonconductive layer 330 between the third semiconductor chip 200C and the fourth semiconductor chip 200D.

The first nonconductive layer 300 may be interposed between the top surface 100a of the lower semiconductor chip 100 and the bottom surface 200Ab of the first semiconductor chip 200A and may also be interposed between the first bumps 250A. The first nonconductive layer 300 may fill a space between the first bumps 250A. The first semiconductor chip 200A may be attached through the first nonconductive layer 300 to the lower semiconductor chip 100. The second nonconductive layer 310 may be interposed between the top surface 200Aa of the first semiconductor chip 200A and the bottom surface 200Bb of the second semiconductor chip 200B and may also be interposed between the second bumps 250B. The second nonconductive layer 310 may fill a space between the second bumps 250B. The second semiconductor chip 200B may be attached through the second nonconductive layer 310 to the first semiconductor chip 200A. The third nonconductive layer 320 may be interposed between the top surface 200Ba of the second semiconductor chip 200B and the bottom surface 200Cb of the third semiconductor chip 200C and may also be interposed between the third bumps 250C. The third nonconductive layer 320 may fill a space between the third bumps 250C. The third semiconductor chip 200C may be attached through the third nonconductive layer 320 to the second semiconductor chip 200B. The fourth nonconductive layer 330 may be interposed between the top surface 200Ca of the third semiconductor chip 200C and the bottom surface 200Db of the fourth semiconductor chip 200D and may also be interposed between the fourth bumps 250D. The fourth nonconductive layer 330 may fill a space between the fourth bumps 250D. The fourth semiconductor chip 200D may be attached through the fourth nonconductive layer 330 to the third semiconductor chip 200C.

The semiconductor package 10 may further include a nonconductive pattern 340 that extends from the nonconductive layers 300, 310, 320, and 330 and covers lateral surfaces 200s of at least one of the plurality of semiconductor chips 200A, 200B, 200C, and 200D. The nonconductive pattern 340 may extend from the nonconductive layers 300, 310, 320, and 330 onto the lateral surfaces 200s of the plurality of semiconductor chips 200A, 200B, 200C, and 200D, and may cover the lateral surfaces 200s of the plurality of semiconductor chips 200A, 200B, 200C, and 200D. The nonconductive pattern 340 may be disposed on the top surface 100a of the lower semiconductor chip 100, and may cover a portion of the top surface 100a of the lower semiconductor chip 100. The nonconductive pattern 340 may protrude laterally (e.g., in the second direction D2 or in a reverse direction to the second direction D2) from the lateral surfaces 200s of the plurality of semiconductor chips 200A, 200B, 200C, and 200D.

The nonconductive layers 300, 310, 320, and 330 and the nonconductive pattern 340 may include the same material. The nonconductive layers 300, 310, 320, and 330 and the nonconductive pattern 340 may include a thermosetting resin, such as at least one selected from bisphenol-type epoxy resin, novolac-type epoxy resin, phenolic resin, urea resin, melamine resin, unsaturated polyester resin, and resorcinol resin.

The semiconductor package 10 may further include a first mold layer 350 that covers a top surface of the nonconductive pattern 340 and a second mold layer 360 that covers a lateral surface of the nonconductive pattern 340. The second mold layer 360 may extend from the lateral surface of the nonconductive pattern 340 onto a lateral surface of the first mold layer 350, and may cover the lateral surface of the first mold layer 350. The first mold layer 350 and the second mold layer 360 may contact each other while having an interface therebetween. The second mold layer 360 may extend onto the lower semiconductor chip 100 from the lateral surface of the nonconductive pattern 340 and may contact one surface of the lower semiconductor chip 100. The nonconductive pattern 340 and the first mold layer 350 may be interposed between the second mold layer 360 and the lateral surfaces 200s of the plurality of semiconductor chips 200A, 200B, 200C, and 200D. The nonconductive pattern 340 may be interposed between the first mold layer 350 and the top surface 100a of the lower semiconductor chip 100 and between the second mold layer 360 and the lateral surfaces 200s of the plurality of semiconductor chips 200A, 200B, 200C, and 200D. The first mold layer 350 and the second mold layer 360 may prevent the nonconductive pattern 340 from being exposed from outside the semiconductor package 10.

According to example embodiments, the second mold layer 360 may cover at least a portion of a lateral surface 100s of the lower semiconductor chip 100. For example, the second mold layer 360 may extend onto and entirely cover the lateral surface 100s of the lower semiconductor chip 100.

The second mold layer 360 may have an inner surface 360IS and an outer surface 360OS that are opposite to each other. The inner surface 360IS of the second mold layer 360 may be in contact with the lateral surface of the nonconductive pattern 340 and with the lateral surface of the first mold layer 350. According to example embodiments, the inner surface 360IS of the second mold layer 360 may be in contact with at least a portion of the lateral surface 100s of the lower semiconductor chip 100. For example, the inner surface 360IS of the second mold layer 360 may be in contact with the entire lateral surface 100s of the lower semiconductor chip 100. The second mold layer 360 may have a thickness 360T in the second direction D2. The thickness 360T of the second mold layer 360 may be a distance between the inner surface 360IS and the outer surface 360OS. The thickness 360T of the second mold layer 360 may range, for example, from about 20 μm to about 50 μm.

The first mold layer 350 and the second mold layer 360 may expose the top surface 200Da of the uppermost semiconductor chip (for example, the fourth semiconductor chip 200D) of the plurality of semiconductor chips 200A, 200B, 200C, and 200D. The top surfaces of first mold layer 350 and the second mold layer 360 may be at substantially the same height (level) as the height (level) of the top surface 200Da of the fourth semiconductor chip 200D. The first mold layer 350 may include a dielectric material (e.g., epoxy molding compound). The second mold layer 360 may include a material the same as or different from that of the first mold layer 350. The second mold layer 360 may include, for example, an epoxy molding compound or an electromagnetic interference (EMI) shielding material.

With the trend of compact size and light weight of the semiconductor package 10, the plurality of semiconductor chips 200A, 200B, 200C, and 200D and the lower semiconductor chip 100 may decrease in thickness. In this case, to achieve uniform adhesion and structural stability of the plurality of semiconductor chips 200A, 200B, 200C, and 200D and the lower semiconductor chip 100, the nonconductive layers 300, 310, 320, and 330 may be used as adhesive materials for the plurality of semiconductor chips 200A, 200B, 200C, and 200D and the lower semiconductor chip 100. After the plurality of semiconductor chips 200A, 200B, 200C, and 200D and the lower semiconductor chip 100 are attached to each other, an overflow of the nonconductive layers 300, 310, 320, and 330 may cause the nonconductive pattern 340 to be formed to cover the lateral surfaces 200s of the plurality of semiconductor chips 200A, 200B, 200C, and 200D. The nonconductive pattern 340 that protrudes from the lateral surfaces 200s of the plurality of semiconductor chips 200A, 200B, 200C, and 200D may cause various problems during fabrication, and this may result in a reduction in quality of the semiconductor package 10.

According to the example embodiments, the first mold layer 350 and the second mold layer 360 may prevent the nonconductive pattern 340, which protrudes from the lateral surfaces 200s of the plurality of semiconductor chips 200A, 200B, 200C, and 200D, from being exposed to an outside of the semiconductor package 10. Therefore, the semiconductor package 10 may be prevented from quality deterioration possibly resulting from the nonconductive pattern 340 during subsequent fabrication processes. In addition, the second mold layer 360 may cover at least a portion of the lateral surface 100s of the lower semiconductor chip 100. Thus, the occurrence of defect (e.g., crack) on the lateral surface 100s of the lower semiconductor chip 100 during subsequent fabrication processes may be minimized. Accordingly, it may be possible to provide the semiconductor package 10 having excellent reliability.

Figure 2:
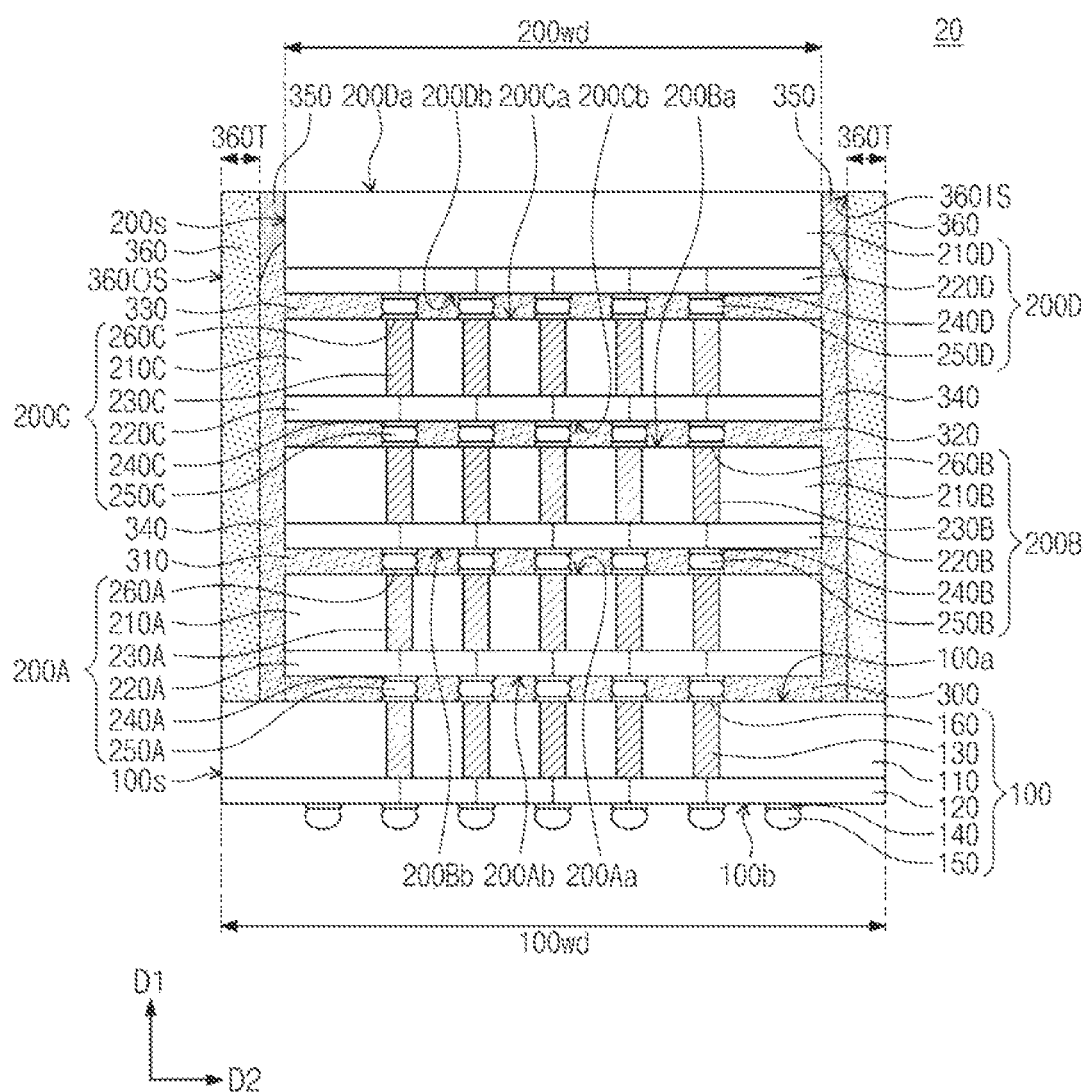

FIG. 2 illustrates a cross-sectional view showing a semiconductor package according to example embodiments. For brevity of description, the following will focus on differences from the semiconductor package 10 discussed with reference to FIG. 1.

Referring to FIG. 2, a semiconductor package 20 may include the lower semiconductor chip 100, the plurality of semiconductor chips 200A, 200B, 200C, and 200D that are vertically stacked on the lower semiconductor chip 100, the nonconductive layers 300, 310, 320, and 330 that are interposed between the plurality of semiconductor chips 200A, 200B, 200C, and 200D and between the lower semiconductor chip 100 and the lowermost semiconductor chip (for example, the first semiconductor chip 200A) of the plurality of semiconductor chips 200A, 200B, 200C, and 200D, the nonconductive pattern 340 that extends from the nonconductive layers 300, 310, 320, and 330 and covers the lateral surfaces 200s of at least one of the plurality of semiconductor chips 200A, 200B, 200C, and 200D, the first mold layer 350 that covers a top surface of the nonconductive pattern 340, and the second mold layer 360 that covers a lateral surface of the nonconductive pattern 340.

The second mold layer 360 may extend from the lateral surface of the nonconductive pattern 340 onto a lateral surface of the first mold layer 350, and may cover the lateral surface of the first mold layer 350. The first mold layer 350 and the second mold layer 360 may contact each other while having an interface therebetween. The second mold layer 360 may extend onto the lower semiconductor chip 100 from the lateral surface of the nonconductive pattern 340 and may contact one surface of the lower semiconductor chip 100. According to example embodiments, the second mold layer 360 may be disposed on the top surface 100a of the lower semiconductor chip 100 and may cover a portion of the top surface 100a of the lower semiconductor chip 100. The second mold layer 360 may expose at least a portion of the lateral surface 100s of the lower semiconductor chip 100. For example, the second mold layer 360 may expose the lateral surface 100s of the lower semiconductor chip 100.

The second mold layer 360 may have an inner surface 360IS and an outer surface 360OS that are opposite to each other. The inner surface 360IS of the second mold layer 360 may be in contact with the lateral surface of the nonconductive pattern 340 and with the lateral surface of the first mold layer 350. According to example embodiments, the outer surface 360OS of the second mold layer 360 may be aligned with at least a portion of the lateral surface 100s of the lower semiconductor chip 100. For example, the outer surface 360OS of the second mold layer 360 may be aligned with the lateral surface 100s of the lower semiconductor chip 100.

According to example embodiments, the first mold layer 350 and the second mold layer 360 may prevent the nonconductive pattern 340, which protrudes from the lateral surfaces 200s of the plurality of semiconductor chips 200A, 200B, 200C, and 200D, from being exposed to an outside of the semiconductor package 20. Therefore, the semiconductor package 20 may be prevented from quality deterioration possibly resulting from the nonconductive pattern 340 during subsequent fabrication processes. Accordingly, it may be possible to provide the semiconductor package 20 having excellent reliability.

Figure 3:
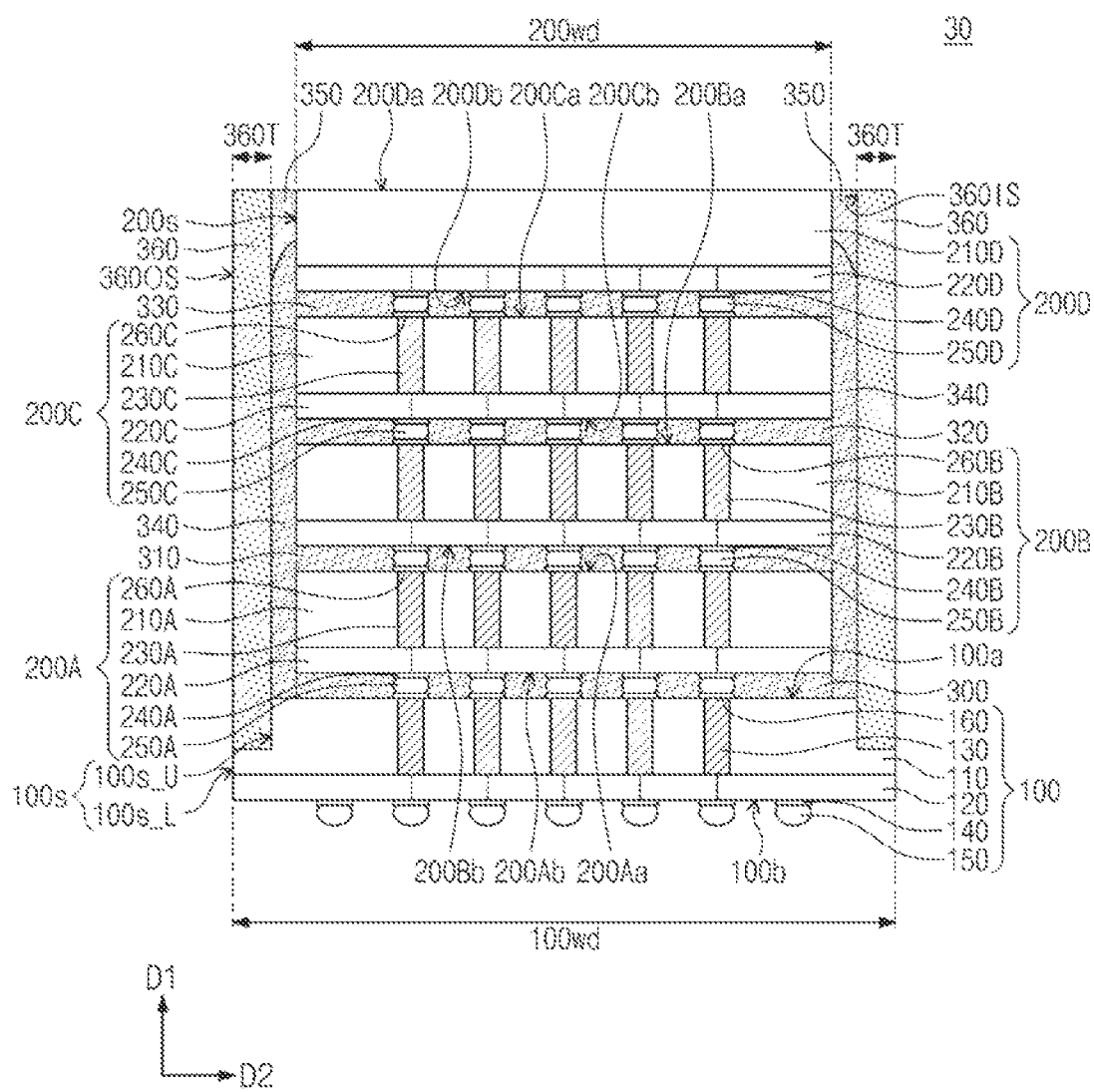

FIG. 3 illustrates a cross-sectional view showing a semiconductor package according to example embodiments. For brevity of description, the following will focus on differences from the semiconductor package 10 discussed with reference to FIG. 1.

Referring to FIG. 3, a semiconductor package 30 may include the lower semiconductor chip 100, the plurality of semiconductor chips 200A, 200B, 200C, and 200D that are vertically stacked on the lower semiconductor chip 100, the nonconductive layers 300, 310, 320, and 330 that are interposed between the plurality of semiconductor chips 200A, 200B, 200C, and 200D and between the lower semiconductor chip 100 and the lowermost semiconductor chip (for example, the first semiconductor chip 200A) of the plurality of semiconductor chips 200A, 200B, 200C, and 200D, the nonconductive pattern 340 that extends from the nonconductive layers 300, 310, 320, and 330 and covers the lateral surfaces 200s of at least one of the plurality of semiconductor chips 200A, 200B, 200C, and 200D, the first mold layer 350 that covers a top surface of the nonconductive pattern 340, and the second mold layer 360 that covers a lateral surface of the nonconductive pattern 340.

The second mold layer 360 may extend from the lateral surface of the nonconductive pattern 340 onto a lateral surface of the first mold layer 350, and may cover the lateral surface of the first mold layer 350. The first mold layer 350 and the second mold layer 360 may contact each other while having an interface therebetween. The second mold layer 360 may extend onto the lower semiconductor chip 100 from the lateral surface of the nonconductive pattern 340, and may contact one surface of the lower semiconductor chip 100. According to example embodiments, the second mold layer 360 may cover at least a portion of a lateral surface 100s of the lower semiconductor chip 100. For example, the second mold layer 360 may extend onto the lateral surface 100s of the lower semiconductor chip 100 and may cover a portion of the lateral surface 100s of the lower semiconductor chip 100 (e.g., an upper lateral surface 100s_U of the lower semiconductor chip 100). The second mold layer 360 may expose another portion of the lateral surface 100s of the lower semiconductor chip 100 (e.g., a lower lateral surface 100s_L of the lower semiconductor chip 100). According to example embodiments, the lower lateral surface 100s_L of the lower semiconductor chip 100 may be offset laterally (e.g., in the second direction D2 or in a reverse direction to the second direction D2) from the upper lateral surface 100s_U of the lower semiconductor chip 100.

The second mold layer 360 may have an inner surface 360IS and an outer surface 360OS that are opposite to each other. The inner surface 360IS of the second mold layer 360 may be in contact with the lateral surface of the nonconductive pattern 340 and with the lateral surface of the first mold layer 350. According to example embodiments, the inner surface 360IS of the second mold layer 360 may contact the upper lateral surface 100s_U of the lower semiconductor chip 100. The outer surface 360OS of the second mold layer 360 may be aligned with at least a portion of the lateral surface 100s of the lower semiconductor chip 100. For example, the outer surface 360OS of the second mold layer 360 may be aligned with the lateral surface 100s of the lower semiconductor chip 100.

According to example embodiments, the first mold layer 350 and the second mold layer 360 may prevent the nonconductive pattern 340, which protrudes from the lateral surfaces 200s of the plurality of semiconductor chips 200A, 200B, 200C, and 200D, from being exposed to an outside of the semiconductor package 30. Therefore, the semiconductor package 30 may be prevented from quality deterioration possibly resulting from the nonconductive pattern 340 during subsequent fabrication processes. In addition, the second mold layer 360 may cover at least a portion of the lateral surface 100s of the lower semiconductor chip 100. Thus, the occurrence of defect (e.g., crack) on the lateral surface 100s of the lower semiconductor chip 100 during subsequent fabrication processes may be minimized. Accordingly, it may be possible to provide the semiconductor package 30 having excellent reliability.

FIGS. 4 to 11 illustrate cross-sectional views showing a method of fabricating a semiconductor package according to example embodiments. The same technical features as those of the semiconductor package discussed with reference to FIGS. 1 to 3 will be omitted in the interest of brevity of description.

Figure 4:
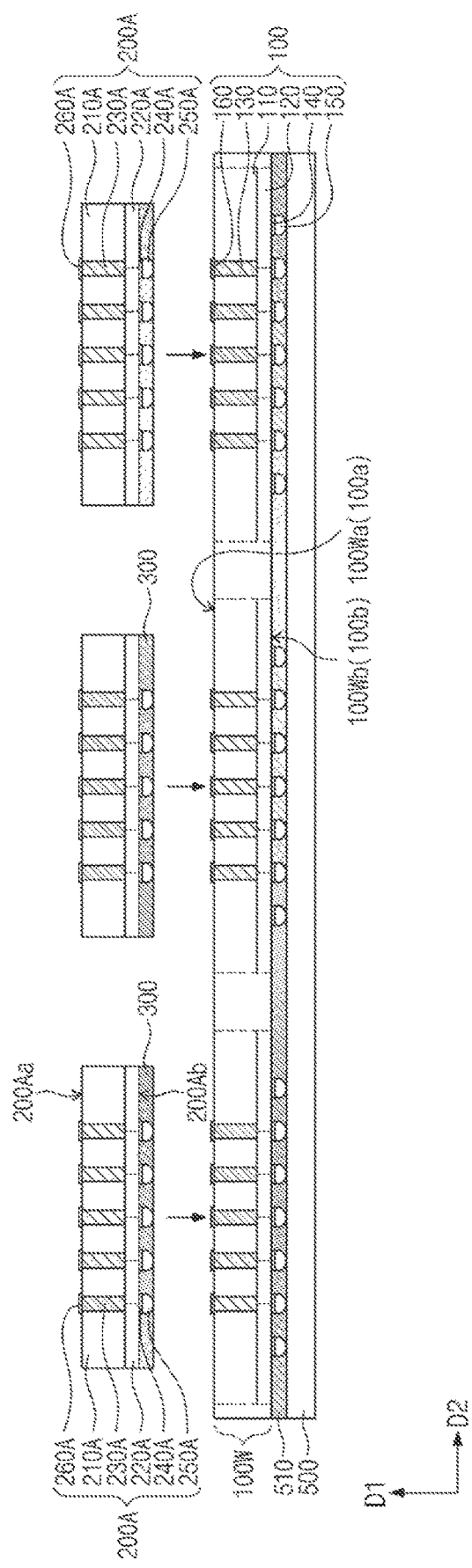
FIGS. 4, 5, 6, 7, 8, 9, 10, and 11 illustrate cross-sectional views showing a method of fabricating a semiconductor package according to example embodiments.

Referring to FIG. 4, a lower substrate 100W may be provided which includes a plurality of lower semiconductor chips 100. The lower substrate 100W may have a top surface 100Wa and a bottom surface 100Wb that are opposite to each other. The top surface 100Wa of the lower substrate 100W may correspond to top surfaces 100a of the plurality of lower semiconductor chips 100, and the bottom surface 100Wb of the lower substrate 100W may correspond to bottom surfaces 100b of the plurality of lower semiconductor chips 100. The plurality of lower semiconductor chips 100 may be arranged in a direction (e.g., the second direction D2) parallel to the top surface 100Wa of the lower substrate 100W. Each of the plurality of lower semiconductor chips 100 may include the lower semiconductor substrate 110, the lower circuit layer 120, the lower through electrodes 130, the first lower chip pads 140, the second lower chip pads 160, and the lower bumps 150 that are discussed with reference to FIG. 1.

The lower substrate 100W may be provided on a carrier substrate 500. The lower substrate 100W may be provided to allow the bottom surface 100Wb of the lower substrate 100W to face the carrier substrate 500. An adhesion layer 510 may be provided between the carrier substrate 500 and the bottom surface 100Wb of the lower substrate 100W, and may be interposed between the lower bumps 150. The lower substrate 100W may be attached through the adhesion layer 510 to the carrier substrate 500.

The first semiconductor chips 200A may be correspondingly provided on the top surface 100Wa of the plurality of lower semiconductor chips 100. Each of the first semiconductor chips 200A may have a top surface 200Aa and a bottom surface 200Ab that are opposite to each other. The first semiconductor chips 200A may be provided to allow the bottom surfaces 200Ab of the first semiconductor chips 200A to correspondingly face the top surfaces 100a of the plurality of lower semiconductor chips 100. Each of the first semiconductor chips 200A may include the first semiconductor substrate 210A, the first circuit layer 220A, the first through electrodes 230A, the first chip pads 240A, the second chip pads 260A, and the first bumps 250A that are discussed with reference to FIG. 1.

A first nonconductive layer 300 may be provided on the bottom surface 200Ab of each of the first semiconductor chips 200A. The first nonconductive layer 300 may cover the first bumps 250A and the bottom surface 200Ab of each of the first semiconductor chips 200A, and may fill a space between the first bumps 250A.

Figure 5:
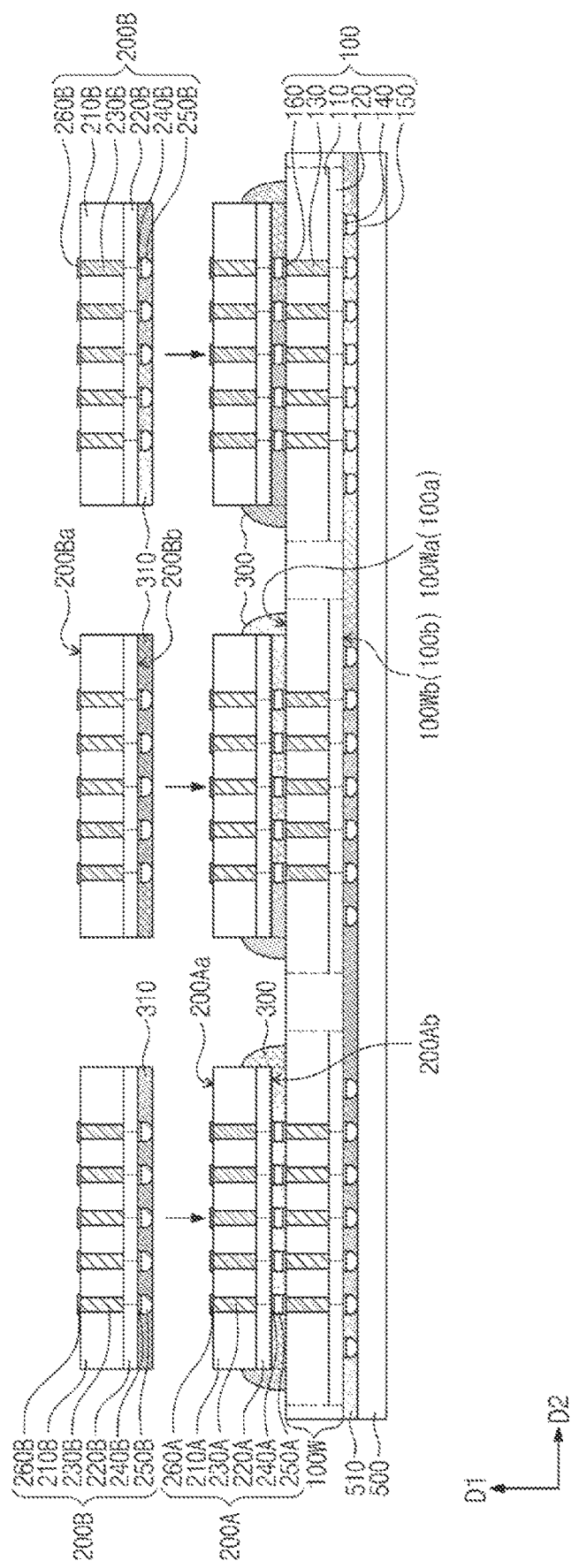

Referring to FIG. 5, a thermocompression process may bond the first semiconductor chips 200A onto corresponding lower semiconductor chips 100. The first bumps 250A of each of the first semiconductor chips 200A may be connected to the second lower chip pads 160 of each of the plurality of lower semiconductor chips 100. The first nonconductive layer 300 may be interposed between the first bumps 250A and between the top surface 100a of each of the plurality of lower semiconductor chips 100 and the bottom surface 200Ab of each of the first semiconductor chips 200A. Each of the first semiconductor chips 200A may be attached through the first nonconductive layer 300 to each of the plurality of lower semiconductor chips 100. During an attachment process in which the first semiconductor chips 200A are attached to the plurality of lower semiconductor chips 100, the first nonconductive layer 300 may overflow to cause a portion of the first nonconductive layer 300 to extend onto a lateral surface of each of the first semiconductor chip 200A and onto the top surface 100a of each of the plurality of lower semiconductor chips 100. The first nonconductive layer 300 may cover the lateral surface of each of the first semiconductor chips 200A.

The second semiconductor chips 200B that are correspondingly provided on the first semiconductor chips 200A may be provided on the top surface 100Wa of the lower substrate 100W. Each of the second semiconductor chips 200B may have a top surface 200Ba and a bottom surface 200Bb that are opposite to each other. The second semiconductor chips 200B may be provided to allow the bottom surfaces 200Bb of the second semiconductor chips 200B to correspondingly face the top surfaces 200Aa of the first semiconductor chips 200A. Each of the second semiconductor chips 200B may include the second semiconductor substrate 210B, the second circuit layer 220B, the second through electrodes 230B, the third chip pads 240B, the fourth chip pads 260B, and the second bumps 250B that are discussed with reference to FIG. 1.

A second nonconductive layer 310 may be provided on the bottom surface 200Bb of each of the second semiconductor chips 200B. The second nonconductive layer 310 may cover the second bumps 250B and the bottom surface 200Bb of each of the second semiconductor chips 200B, and may fill a space between the second bumps 250B.

Figure 6:
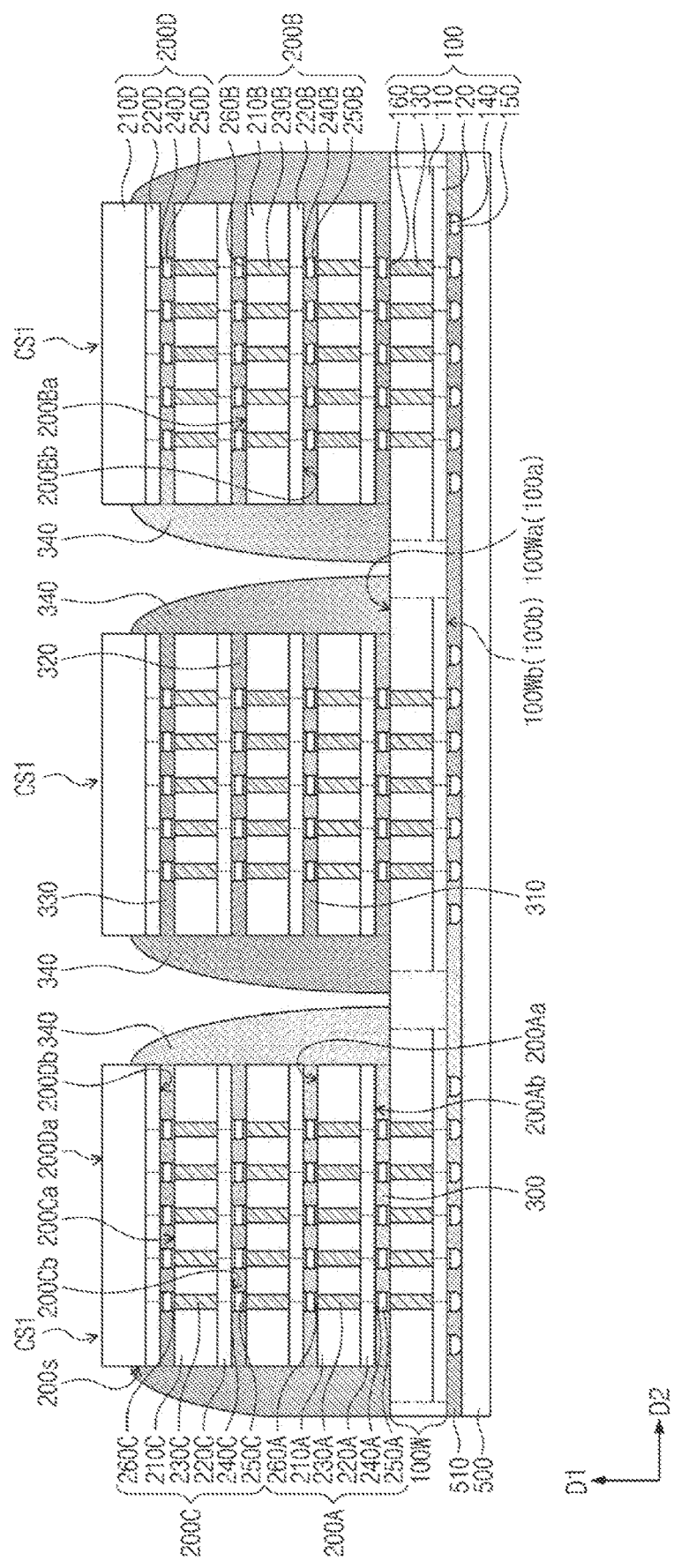

Referring to FIG. 6, a thermocompression process may bond the second semiconductor chips 200B onto corresponding first semiconductor chips 200A. The second bumps 250B of each of the second semiconductor chips 200B may be connected to the second chip pads 260A of each of the first semiconductor chips 200A. The second nonconductive layer 310 may be interposed between the second bumps 250B and between the top surface 200Aa of each of the first semiconductor chips 200A and the bottom surface 200Bb of each of the second semiconductor chips 200B. Each of the second semiconductor chips 200B may be attached through the second nonconductive layer 310 to each of the first semiconductor chips 200A. During an attachment process in which the first semiconductor chips 200A are attached to the second semiconductor chips 200B, the second nonconductive layer 310 may overflow to cause a portion of the second nonconductive layer 310 to extend onto a lateral surface of each of the first semiconductor chip 200A and onto a lateral surface of each of the second semiconductor chips 200B. The second nonconductive layer 310 may cover the lateral surface of each of the first semiconductor chips 200A and the lateral surface of each of the second semiconductor chips 200B.

The third semiconductor chips 200C that are correspondingly provided on the second semiconductor chips 200B may be provided on the top surface 100Wa of the lower substrate 100W. Each of the third semiconductor chips 200C may have a top surface 200Ca and a bottom surface 200Cb that are opposite to each other, and the bottom surfaces 200Cb of the third semiconductor chips 200C may be provided to correspondingly face the top surfaces 200Ba of the second semiconductor chips 200B. Each of the third semiconductor chips 200C may include the third semiconductor substrate 210C, the third circuit layer 220C, the third through electrodes 230C, the fifth chip pads 240C, the sixth chip pads 260C, and the third bumps 250C that are discussed with reference to FIG. 1. A third nonconductive layer 320 may be provided on the bottom surface 200Cb of each of the third semiconductor chips 200C. The third nonconductive layer 320 may cover the third bumps 250C and the bottom surface 200Cb of each of the third semiconductor chips 200C, and may fill a space between the third bumps 250C. The third semiconductor chips 200C may be correspondingly attached to the second semiconductor chips 200B by using a method substantially the same as that used for attachment between the first and second semiconductor chips 200A and 200B.

The fourth semiconductor chips 200D that are correspondingly provided on the third semiconductor chips 200C may be provided on the top surface 100Wa of the lower substrate 100W. Each of the fourth semiconductor chips 200D may have a top surface 200Da and a bottom surface 200Db that are opposite to each other, and the bottom surfaces 200Db of the fourth semiconductor chips 200D may be provided to correspondingly face the top surfaces 200Ca of the third semiconductor chips 200C. Each of the fourth semiconductor chips 200D may include the fourth semiconductor substrate 210D, the fourth circuit layer 220D, the seventh chip pads 240D, and the fourth bumps 250D that are discussed with reference to FIG. 1. A fourth nonconductive layer 330 may be provided on the bottom surface 220Db of each of the fourth semiconductor chips 200D. The fourth nonconductive layer 330 may cover the fourth bumps 250D and the bottom surface 200Db of each of the fourth semiconductor chips 200D, and may fill a space between the fourth bumps 250D. The fourth semiconductor chips 200D may be correspondingly attached to the third semiconductor chips 200C by using a method substantially the same as that used for attachment between the first semiconductor chip 200A and the second semiconductor chip 200B.

As the first, second, third, and fourth semiconductor chips 200A, 200B, 200C, and 200D are attached onto the plurality of lower semiconductor chips 100, a plurality of first chip stacks CS1 may be correspondingly mounted on the plurality of lower semiconductor chips 100. Each of the plurality of first chip stacks CS1 may include its corresponding first, second, third, and fourth semiconductor chips 200A, 200B, 200C, and 200D that are sequentially stacked on each of the plurality of lower semiconductor chips 100. Each of the plurality of first chip stacks CS1 may further include the first, second, third, and fourth nonconductive layers 300, 310, 320, and 330 that are interposed between each of the plurality of lower semiconductor chips 100 and the corresponding first semiconductor chip 200A and between the corresponding first, second, third, and fourth semiconductor chips 200A, 200B, 200C, and 200D, and may also further include a nonconductive pattern 340 that extends from the first, second, third, and fourth nonconductive layers 300, 310, 320, and 330 and covers lateral surfaces 200s of at least one of the corresponding first, second, third, and fourth semiconductor chips 200A, 200B, 200C, and 200D.

During an attachment process in which the first, second, third, and fourth semiconductor chips 200A, 200B, 200C, and 200D are attached onto the plurality of lower semiconductor chips 100, the first, second, third, and fourth nonconductive layers 300, 310, 320, and 330 may overflow and extend onto the lateral surfaces 200s of at least one of the corresponding first, second, third, and fourth semiconductor chips 200A, 200B, 200C, and 200D. As a result, the nonconductive pattern 340 may be formed on the lateral surface 200s of at least one of the corresponding first, second, third, and fourth semiconductor chips 200A, 200B, 200C, and 200D. The nonconductive pattern 340 may extend from the first, second, third, and fourth nonconductive layers 300, 310, 320, and 330 onto the lateral surface 200s of at least one of the corresponding first, second, third, and fourth semiconductor chips 200A, 200B, 200C, and 200D, and may cover the lateral surface 200s of at least one of the corresponding first, second, third, and fourth semiconductor chips 200A, 200B, 200C, and 200D. The nonconductive pattern 340 may extend onto the top surface 100a of each of the plurality of lower semiconductor chips 100, and may cover a portion of the top surface 100a of each of the plurality of lower semiconductor chips 100.

Figure 7:
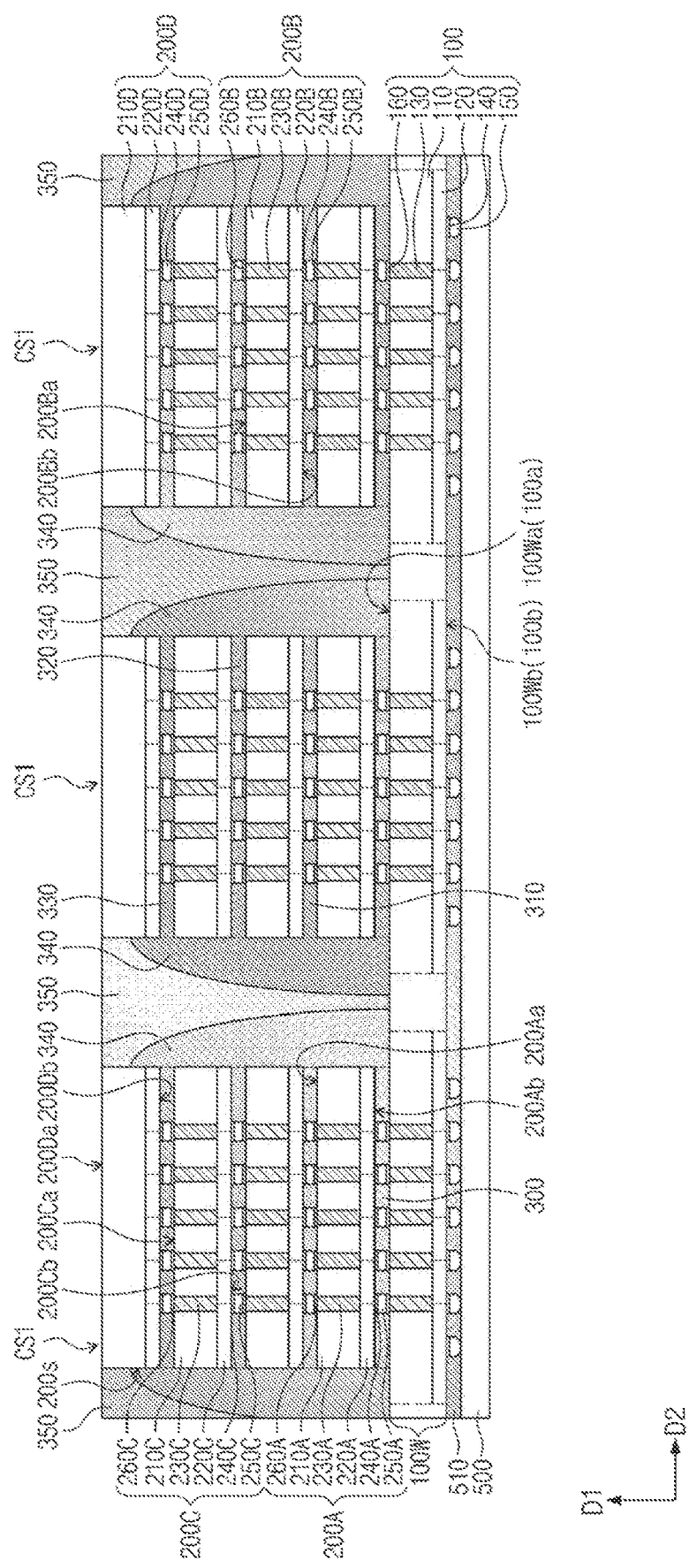

Referring to FIG. 7, a first mold layer 350 may be formed on the top surface 100Wa of the lower substrate 100W and may cover the plurality of first chip stacks CS1. The first mold layer 350 may be interposed between the plurality of first chip stacks CS1 and may fill a space between the plurality of first chip stacks CS1. According to example embodiments, the first mold layer 350 may be grinded until exposure of a top surface CS1a of each of the plurality of first chip stacks CS1. The top surface CS1a of each of the plurality of first chip stacks CS1 may correspond to a top surface of an uppermost semiconductor chip (e.g., the top surface 200Da of the fourth semiconductor chip 200D). According to example embodiments, it may be possible to omit the grinding process of the first mold layer 350, and in this case, the first mold layer 350 may cover the top surface CS1a of each of the plurality of first chip stacks CS1.

Figure 8:
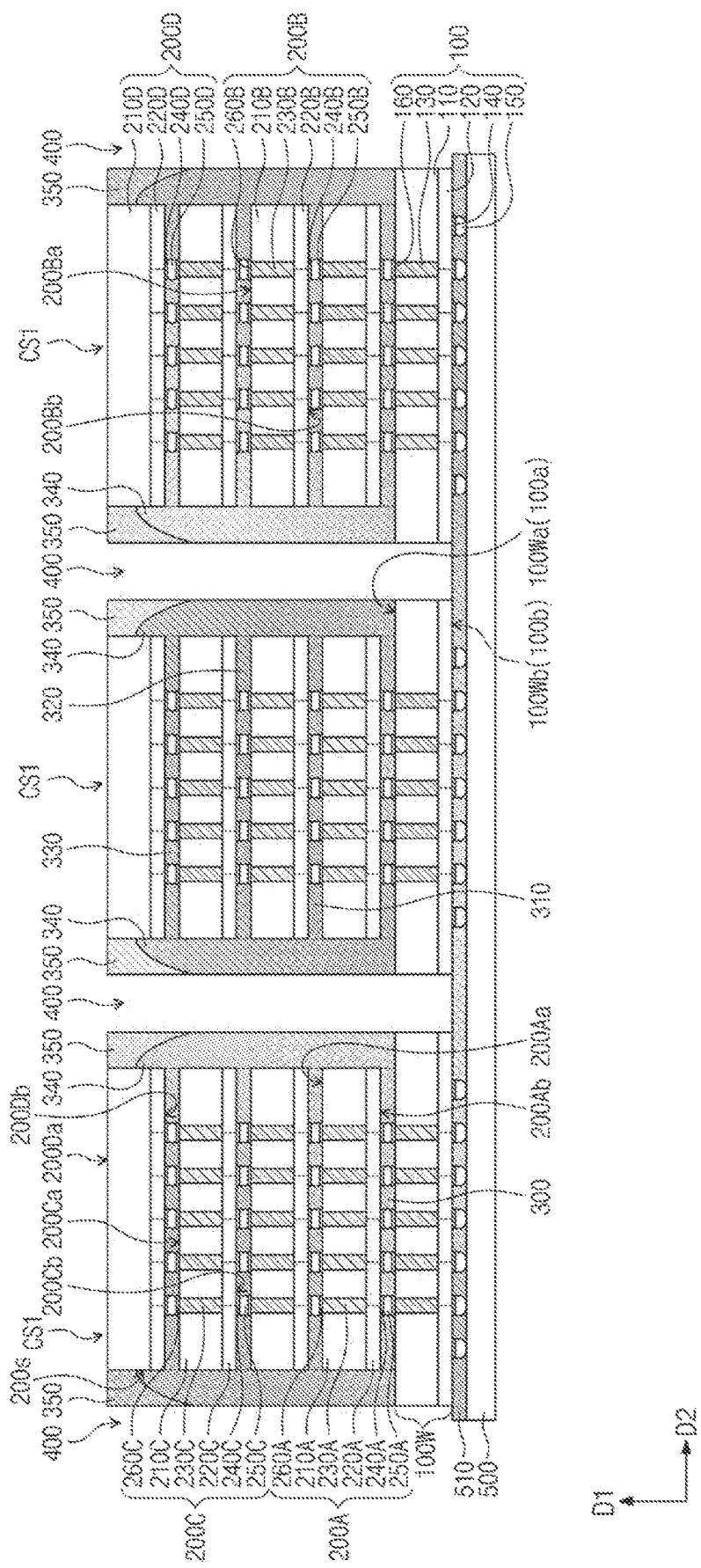

Referring to FIG. 8, a plurality of openings 400 may be formed in the first mold layer 350 between the plurality of first chip stacks CS1. Each of the plurality of openings 400 may penetrate the first mold layer 350 between neighboring ones of the plurality of first chip stacks CS1. Each of the plurality of openings 400 may expose a lateral surface of the nonconductive pattern 340 of each of the plurality of first chip stacks CS1. According to some embodiments, each of the plurality of openings 400 may be formed to penetrate at least a portion of the lower substrate 100W. For example, each of the plurality of openings 400 may penetrate the lower substrate 100W between the plurality of lower semiconductor chips 100, and may separate the plurality of lower semiconductor chips 100 from each other. The plurality of lower semiconductor chips 100 may be spaced apart from each other across the plurality of openings 400. The plurality of openings 400 may be formed by, for example, a cutting process that uses a blade.

Figure 9:
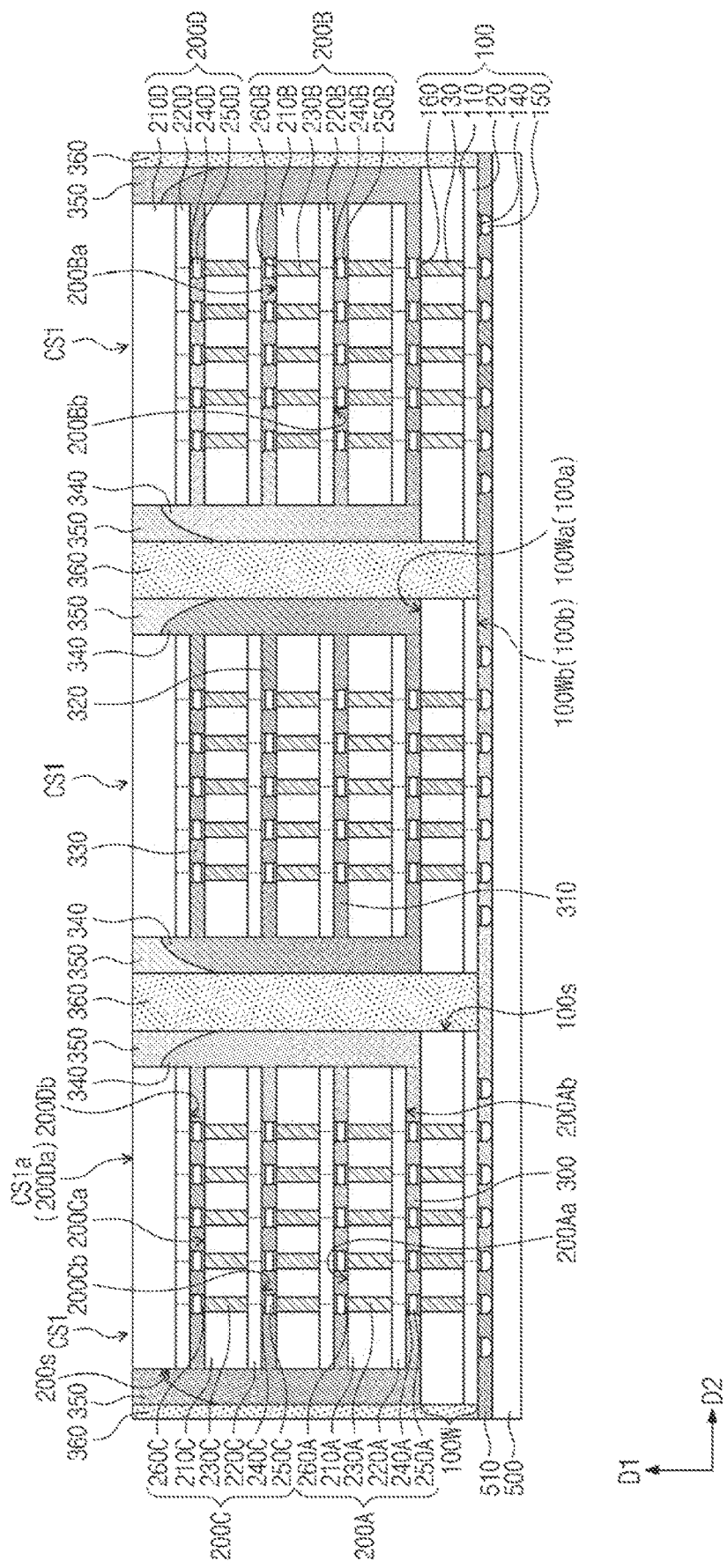

Referring to FIG. 9, a second mold layer 360 may be formed to fill the plurality of openings 400. The second mold layer 360 may cover the exposed lateral surface of the nonconductive pattern 340 of each of the plurality of first chip stacks CS1. The second mold layer 360 may be interposed between the plurality of first chip stacks CS1. According to example embodiments, the second mold layer 360 may extend between the plurality of lower semiconductor chips 100 and may cover lateral surfaces 100s of the plurality of lower semiconductor chips 100. The second mold layer 360 may be grinded until exposure of the top surface CS1a of each of the plurality of first chip stacks CS1. The top surface CS1a of each of the plurality of first chip stacks CS1 may correspond to a top surface of an uppermost semiconductor chip (e.g., the top surface 200Da of the fourth semiconductor chip 200D). According to example embodiments, the first mold layer 350 may be interposed between the second mold layer 360 and the top surface CS1a of each of the plurality of first chip stacks CS1, and in this case, the first mold layer 350 and the second mold layer 360 may be grinded until the top surface CS1a of each of the plurality of first chip stacks CS1 is exposed.

Figure 10:
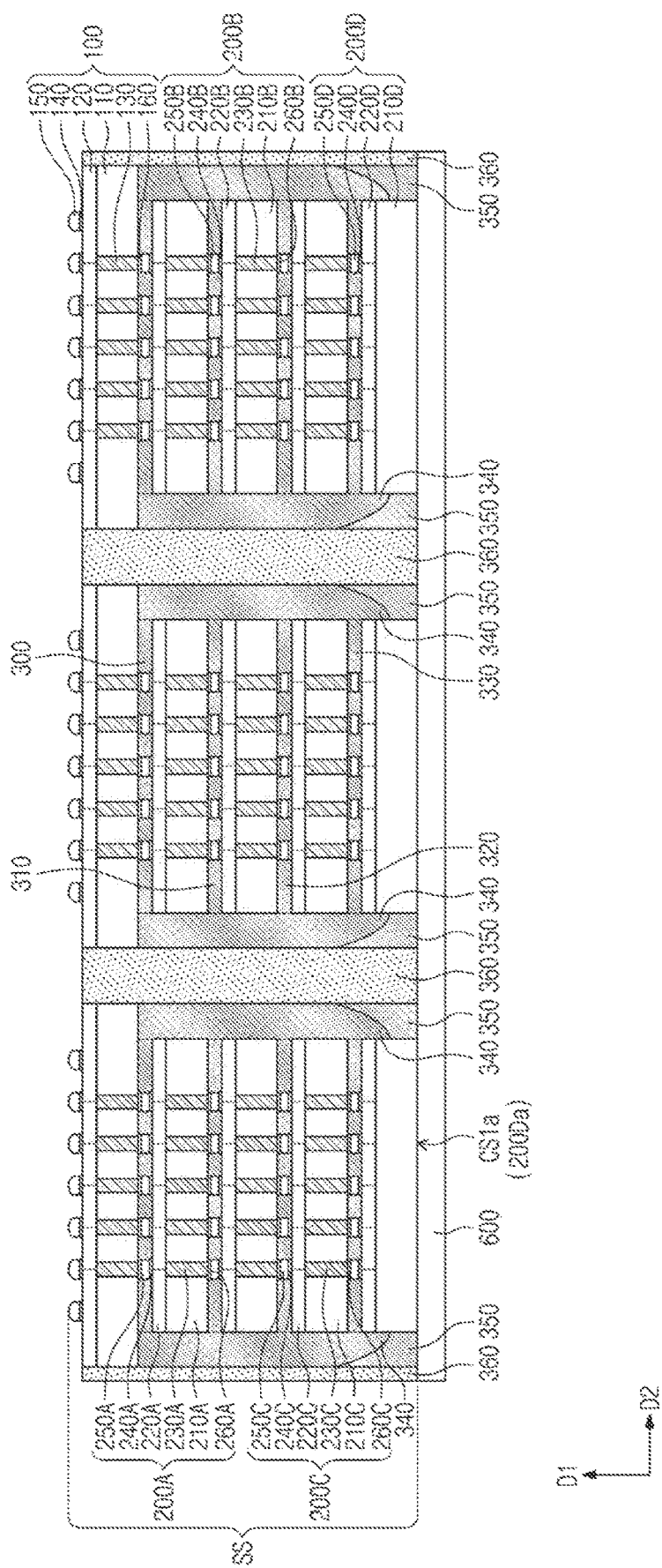

Referring to FIG. 10, a stack structure SS that includes the plurality of lower semiconductor chips 100, the plurality of first chip stacks CS1, the first mold layer 350, and the second mold layer 360 may be provide on the support substrate 600. The stack structure SS may be provided to allow the top surfaces CS1a of the plurality of first chip stacks CS1 to face the support substrate 600. The carrier substrate 500 and the adhesion layer 510 may be removed from the stack structure SS.

Figure 11:
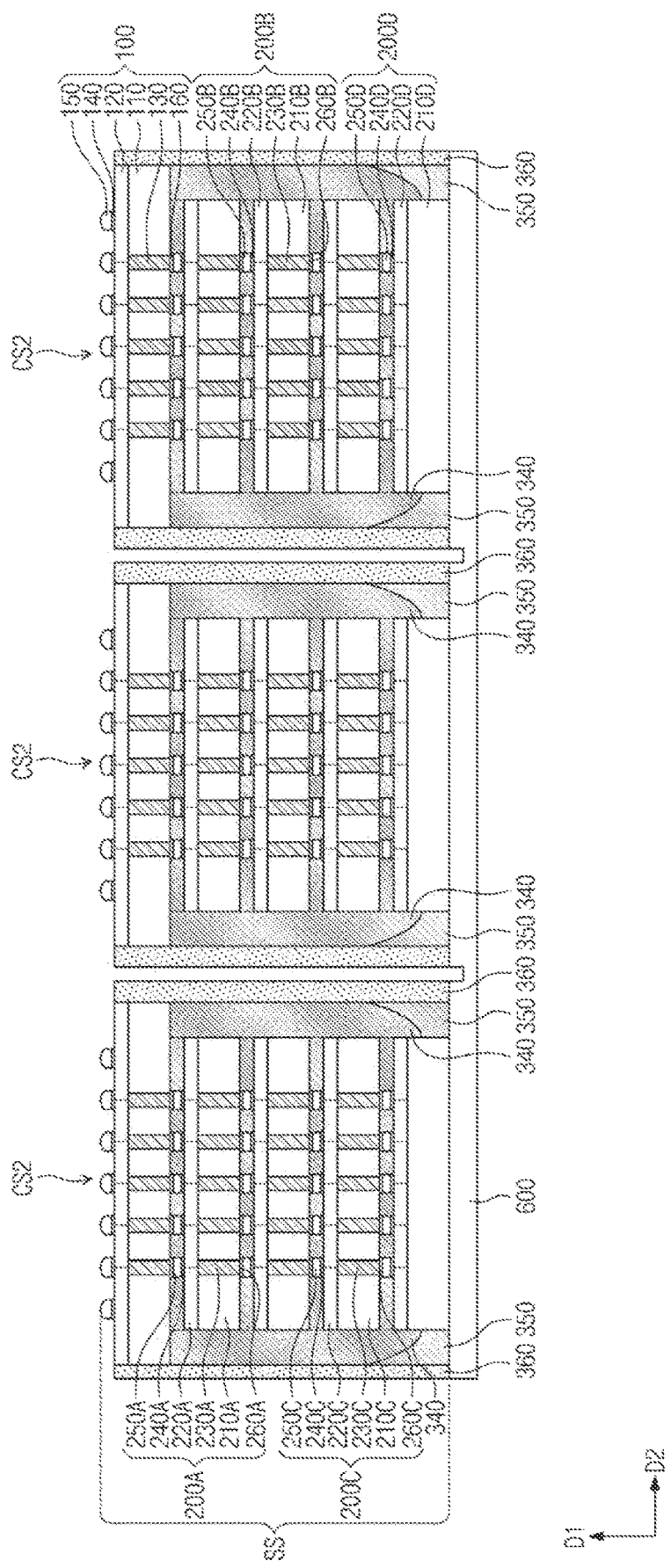

Referring to FIG. 11, the stack structure SS may undergo a cutting process that uses a blade, and thus the stack structure SS may be separated into a plurality of second chip stacks CS2. The plurality of second chip stacks CS2 may be formed by cutting the second mold layer 360 between the plurality of first chip stacks CS1 and between the plurality of lower semiconductor chips 100. After the formation of the plurality of second chip stacks CS2, the support substrate 600 may be removed. According to example embodiments, each of the plurality of second chip stacks CS2 may be substantially the same as the semiconductor package 10 discussed with reference to FIG. 1.

Figure 12:
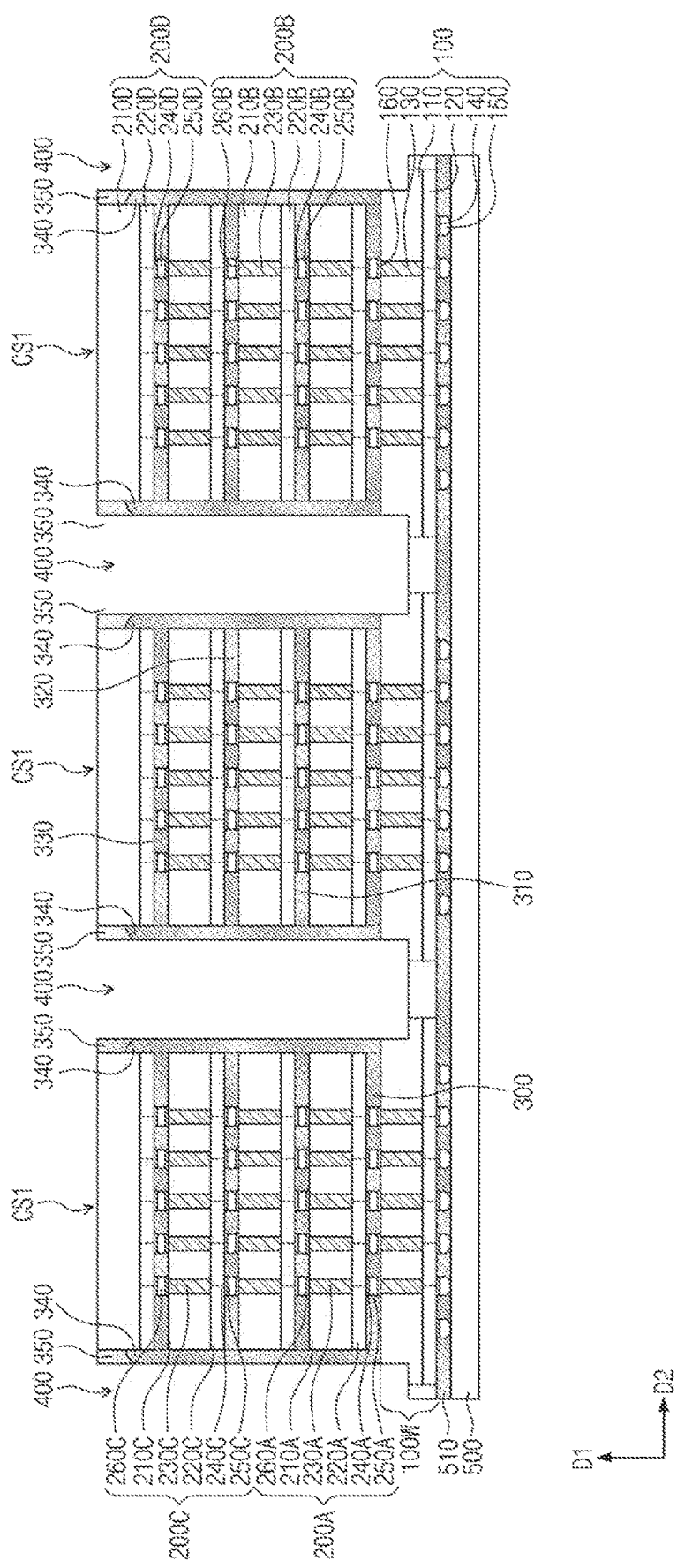
FIGS. 12 and 13 illustrate cross-sectional views showing a method of fabricating a semiconductor package according to example embodiments.

FIG. 12 illustrates a cross-sectional view showing a method of fabricating a semiconductor package according to example embodiments. For brevity of description, the following will focus on differences from the method of fabricating a semiconductor package discussed with reference to FIGS. 4 to 11.

Referring to FIG. 12, a plurality of openings 400 may be formed in the first mold layer 350 between the plurality of first chip stacks CS1. Each of the plurality of openings 400 may penetrate the first mold layer 350 between neighboring ones of the plurality of first chip stacks CS1. Each of the plurality of openings 400 may expose a lateral surface of the nonconductive pattern 340 of each of the plurality of first chip stacks CS1. According to example embodiments, each of the plurality of openings 400 may be formed to penetrate at least a portion of the lower substrate 100W. For example, each of the plurality of openings 400 may partially penetrate the lower substrate 100W between the plurality of lower semiconductor chips 100. Each of the plurality of opening 400 may penetrate an upper portion of the lower substrate 100W between the plurality of lower semiconductor chips 100 and may expose a lower portion of the lower substrate 100W between the plurality of lower semiconductor chips 100.

As discussed with reference to FIG. 9, a second mold layer 360 may be formed to fill the plurality of openings 400. The second mold layer 360 may cover the exposed lateral surface of the nonconductive pattern 340 of each of the plurality of first chip stacks CS1. The second mold layer 360 may be interposed between the plurality of first chip stacks CS1. According to example embodiments, the second mold layer 360 may extend between the plurality of lower semiconductor chips 100 and may partially cover lateral surfaces 100s of the plurality of lower semiconductor chips 100. Afterwards, as discussed with reference to FIG. 11, a plurality of second chip stacks CS2 may be formed. According to example embodiments, the formation of the plurality of second chip stacks CS2 may include cutting the second mold layer 360 between the plurality of first chip stacks CS1 and cutting the lower substrate 100W to cause the plurality of lower semiconductor chips 100 to separate from each other. According to example embodiments, each of the plurality of second chip stacks CS2 may be substantially the same as the semiconductor package 30 discussed with reference to FIG. 3.

Figure 13:
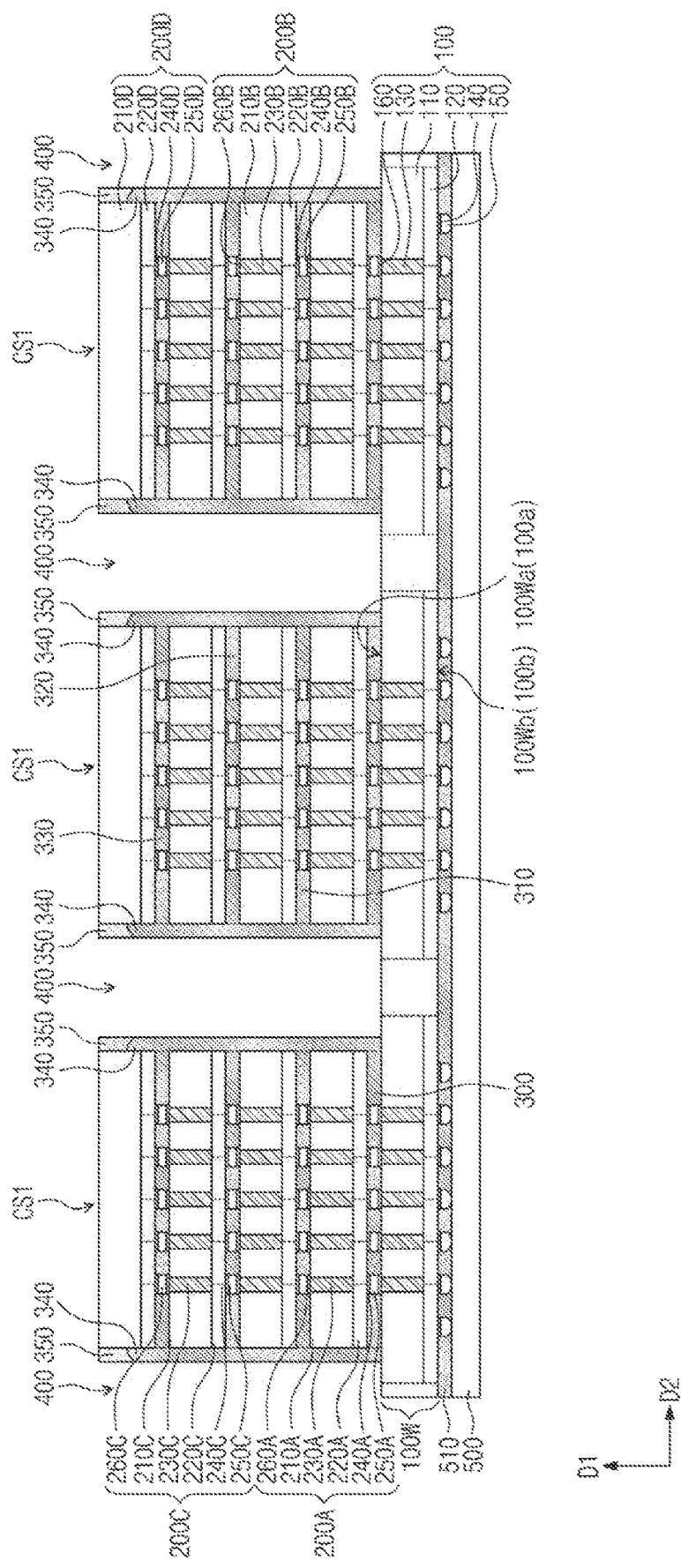

FIG. 13 illustrates a cross-sectional view showing a method of fabricating a semiconductor package according to example embodiments. For brevity of description, the following will focus on differences from the method of fabricating a semiconductor package discussed with reference to FIGS. 4 to 11.

Referring to FIG. 13, a plurality of openings 400 may be formed in the first mold layer 350 between the plurality of first chip stacks CS1. Each of the plurality of openings 400 may penetrate the first mold layer 350 between neighboring ones of the plurality of first chip stacks CS1. Each of the plurality of openings 400 may expose a lateral surface of the nonconductive pattern 340 of each of the plurality of first chip stacks CS1. According to example embodiments, each of the plurality of openings 400 may be formed to expose the top surface 100Wa of the lower substrate 100W.

As discussed with reference to FIG. 9, a second mold layer 360 may be formed to fill the plurality of openings 400. The second mold layer 360 may cover the exposed lateral surface of the nonconductive pattern 340 of each of the plurality of first chip stacks CS1. The second mold layer 360 may be interposed between the plurality of first chip stacks CS1. According to example embodiments, the second mold layer 360 may be formed on the top surface 100Wa of the lower substrate 100W. Afterwards, as discussed with reference to FIG. 11, a plurality of second chip stacks CS2 may be formed. According to example embodiments, the formation of the plurality of second chip stacks CS2 may include cutting the second mold layer 360 between the plurality of first chip stacks CS1 and cutting the lower substrate 100W to cause the plurality of lower semiconductor chips 100 to separate from each other. According to example embodiments, each of the plurality of second chip stacks CS2 may be substantially the same as the semiconductor package 20 discussed with reference to FIG. 2.

Figure 14:
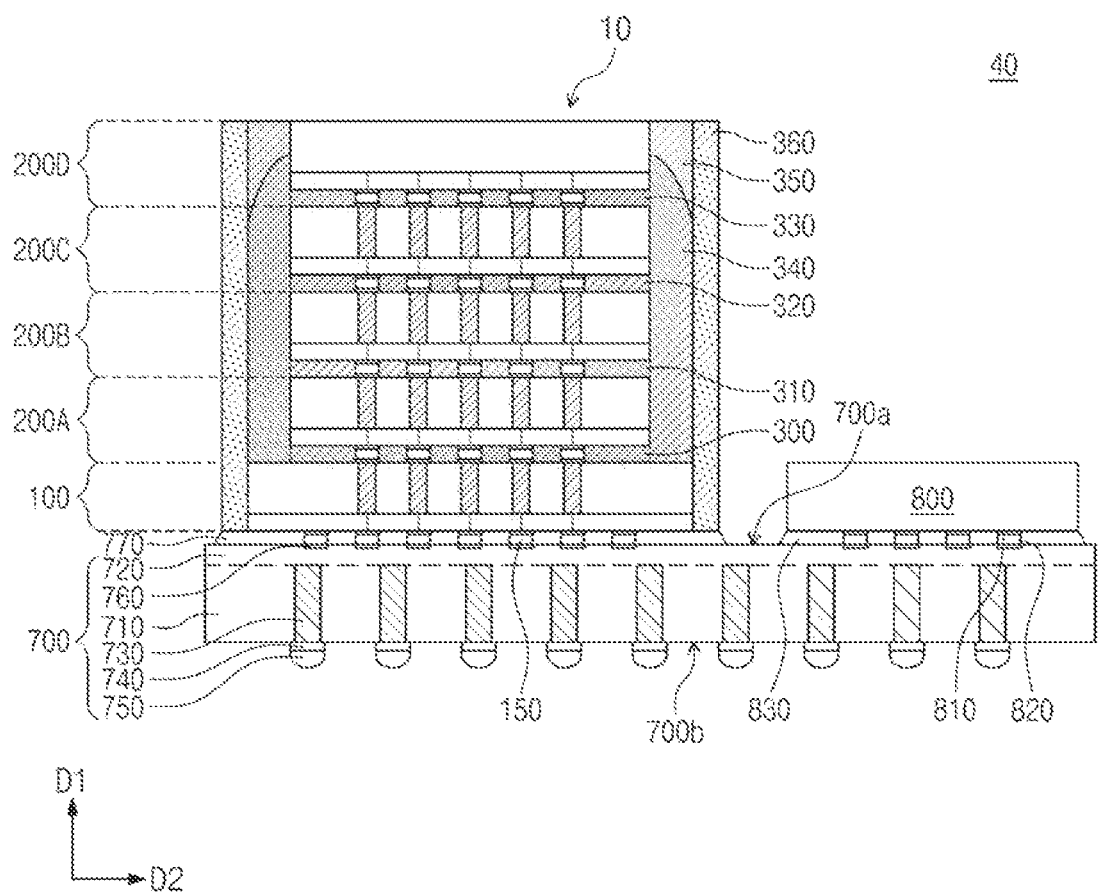
FIGS. 14 and 15 illustrate cross-sectional views showing a semiconductor package according to example embodiments.

FIG. 14 illustrates a cross-sectional view showing a semiconductor package according to example embodiments. For brevity of description, the following will focus on differences from the semiconductor package discussed with reference to FIGS. 1 to 3.

Referring to FIG. 14, a semiconductor package 40 may include a first substrate 700, a unit chip package 10 mounted on the first substrate 700, and an additional semiconductor chip 800 mounted on the first substrate 700.

The first substrate 700 may be an interposer substrate. The first substrate 700 may include a base substrate 710, a plurality of through electrodes 730 that penetrate the base substrate 710, and a wiring layer 720 on the base substrate 710. The base substrate 710 may be, for example, a silicon substrate. The plurality of through electrodes 730 may be horizontally spaced apart from each other in the base substrate 710, and each of the plurality of through electrodes 730 may penetrate the base substrate 710. The plurality of through electrodes 730 may include metal (e.g., copper (Cu)). The wiring layer 720 may include metal patterns electrically connected to the plurality of through electrodes 730.

The first substrate 700 may have a first surface 700a and a second surface 700b that are opposite to each other, and the wiring layer 720 may be adjacent to the first surface 700a. The second surface 700b of the first substrate 700 may correspond to one surface of the base substrate 710. Each of the plurality of through electrodes 730 may extend from the wiring layer 720 toward the second surface 700b.

The first substrate 700 may be provided with first conductive pads 740 on the second surface 700b thereof. The first conductive pads 740 may be spaced apart in a direction (e.g., the second direction D2) parallel to the second surface 700b of the first substrate 700, and each of the plurality of through electrodes 730 may be connected to a corresponding one of the first conductive pads 740. The first conductive pads 740 may include a conductive material (e.g., metal).

The first connection bumps 750 that are correspondingly connected to the first conductive pads 740 may be provided on the second surface 700b of the first substrate 700. The first connection bumps 750 may be correspondingly disposed on the first conductive pads 740. The first connection bumps 750 may include a conductive material and may have at least one of solder-ball shapes, bump shapes, and pillar shapes.

The first substrate 700 may be provided with second conductive pads 760 adjacent to the first surface 700a thereof. The second conductive pads 760 may be spaced apart from each other in a direction (e.g., the second direction D2) parallel to the first surface 700a of the first substrate 700. The second conductive pads 760 may be connected to the metal patterns in the wiring layer 720, and may be electrically connected through the metal patterns to the plurality of through electrodes 730. The second conductive pads 760 may include a conductive material (e.g., metal).

The unit chip package 10 and the additional semiconductor chip 800 may be mounted on the first surface 700a of the first substrate 700. The unit chip package 10 and the additional semiconductor chip 800 may be spaced apart from each other in a direction (e.g., the second direction D2) parallel to the first surface 700a of the first substrate 700. According to example embodiments, the unit chip package 10 may be the semiconductor package 10 discussed with reference to FIG. 1. According to other example embodiments, the unit chip package 10 may be one of the semiconductor packages 20 and 30 discussed with reference to FIGS. 2 and 3. In this case, the lower semiconductor chip 100 of the unit chip package 10 may be mounted on the first surface 700a of the first substrate 700, and the lower bumps 150 of the lower semiconductor chip 100 may be connected to corresponding ones of the second conductive pads 760 of the first substrate 700. The unit chip package 10 may be electrically connected to the wiring layer 720 of the first substrate 700 through the lower bumps 150 and their corresponding second conductive pads 760.

A first under-fill layer 770 may be interposed between the first substrate 700 and the lower semiconductor chip 100 of the unit chip package 10, and may fill the lower bumps 150 of the lower semiconductor chip 100. The first under-fill layer 770 may include a dielectric polymer material, such as an epoxy resin. The second mold layer 360 of the unit chip package 10 may be vertically spaced apart from the first surface 700a of the first substrate 700. For example, the second mold layer 360 of the unit chip package 10 may be spaced apart from the first surface 700a of the first substrate 700 along a direction (e.g., the first direction D1) perpendicular to the first surface 700a of the first substrate 700.

The additional semiconductor chip 800 may be horizontally spaced apart from the unit chip package 10. The additional semiconductor chip 800 may be mounted horizontally spaced apart from the lower semiconductor chip 100 of the unit chip package 10. The additional semiconductor chip 800 may include additional chip pads 810 disposed on one surface of the additional semiconductor chip 800 and additional bumps 820 correspondingly connected to the additional chip pads 810. The additional bumps 820 may be connected to corresponding ones of the second conductive pads 760 of the first substrate 700. The additional semiconductor chip 800 may be electrically connected to the wiring layer 720 of the first substrate 700 through the additional bumps 820 and their corresponding second conductive pads 760.

A second under-fill layer 830 may be interposed between the additional semiconductor chip 800 and the first substrate 700, and may cover the additional bumps 820 of the additional semiconductor chip 800. The second under-fill layer 830 may include a dielectric polymer material, such as an epoxy resin.

The unit chip package 10 and the additional semiconductor chip 800 may be electrically connected to each other through the metal patterns included in the wiring layer 720 of the first substrate 700. For example, the unit chip package 10 may include a high bandwidth memory (HBM) chip, and the additional semiconductor chip 800 may be a memory chip, a logic chip, an application processor (AP) chip, or a system-on-chip (SOC).

Figure 15:
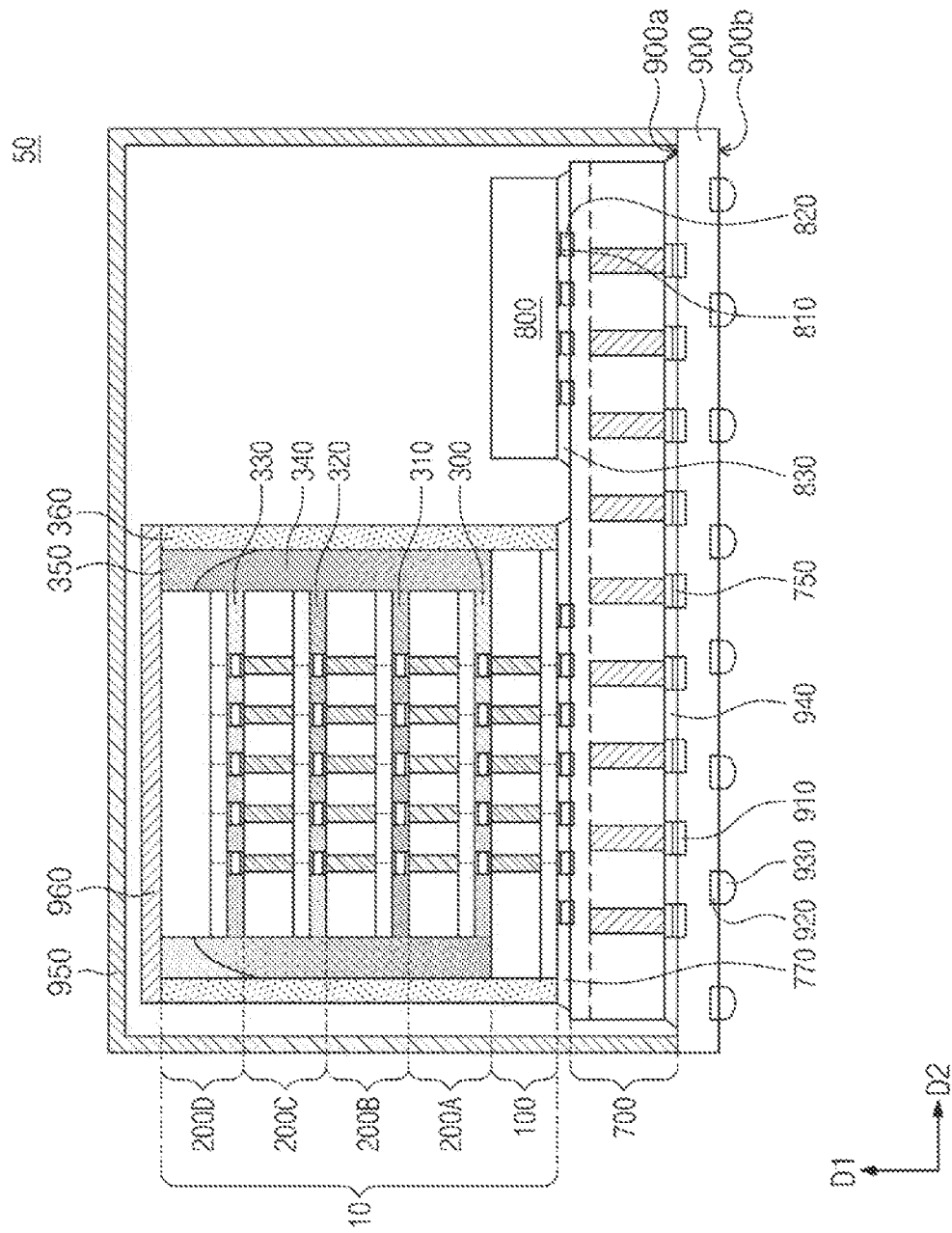

FIG. 15 illustrates a cross-sectional view showing a semiconductor package according to example embodiments. For brevity of description, the following will focus on differences from the semiconductor package discussed with reference to FIGS. 1 to 3 and 14.

Referring to FIG. 15, a semiconductor package 50 may further include a second substrate 900 and a thermal radiation structure 950 on the second substrate 900. Components of one or more of the semiconductor packages discussed with reference to FIGS. 1 to 3 and 14 may be disposed on the second substrate 900 and in the thermal radiation structure 950.

The second substrate 900 may include first substrate pads 910 adjacent to a first surface 900a of the second substrate 900 and second substrate pads 920 adjacent to a second surface 900b of the second substrate 900. The first substrate pads 910 may be electrically connected to the second substrate pads 920 through internal lines included in the second substrate 900. The first substrate pads 910 and the second substrate pads 920 may include a conductive material. The second connection bumps 930 that are correspondingly connected to the second substrate pads 920 may be provided on the second surface 900b of the second substrate 900. The second connection bumps 930 may include a conductive material and may have at least one of solder-ball shapes, bump shapes, and pillar shapes. The second substrate 900 may be, for example, a printed circuit board, a semiconductor chip, or a semiconductor package.

The first substrate 700 may be mounted on the first surface 900a of the second substrate 900. The first connection bumps 750 of the first substrate 700 may be connected to corresponding ones of the first substrate pads 910 of the second substrate 900. The first substrate 700 may be electrically connected to the second substrate 900 through the first connection bumps 750 and the first substrate pads 910.

A lower under-fill layer 940 may be disposed between the first substrate 700 and the second substrate 900, and may cover the first connection bumps 750. The lower under-fill layer 940 may include a dielectric polymer material, such as an epoxy resin.

The thermal radiation structure 950 may be disposed on the first surface 900a of the second substrate 900, and may cover components of one or more of the semiconductor packages discussed with reference to FIGS. 1 to 3 and 14. The thermal radiation structure 950 may include a thermal conductive material. The thermal conductive material may include a metallic material (e.g., copper and/or aluminum) or a carbon-containing material (e.g., graphene, graphite, and/or carbon nano-tube). For example, the thermal radiation structure 950 may include a single metal layer or a plurality of stacked metal layers. As another example, the thermal radiation structure 950 may include a heat sink or a heat pipe. As another example, the thermal radiation structure 950 may be configured to use water cooling.

The semiconductor package 50 may further include a thermal conductive layer 960 interposed between the unit chip package 10 and the thermal radiation structure 950. The thermal conductive layer 960 may include a thermal interface material (TIM). The thermal interface material may include, for example, a polymer and thermal conductive particles. The thermal conductive particles may be dispersed within the polymer. Heat generated from the unit chip package 10 may be transmitted through the thermal conductive layer 960 to the thermal radiation structure 950.

According to example embodiments, a semiconductor package may include a plurality of semiconductor chips that are vertically stacked on a lower semiconductor chip, a nonconductive pattern that protrudes from lateral surfaces of the plurality of semiconductor chips, and a first mold layer and a second mold layer that cover the nonconductive pattern. The nonconductive pattern may be covered with the first mold layer and the second mold layer, and may not be exposed to an outside of the semiconductor package. Therefore, the semiconductor package may be prevented from experiencing quality deterioration possibly resulting from the nonconductive pattern during subsequent fabrication processes. In addition, the second mold layer may cover at least a portion of a lateral surface of the lower semiconductor chip. Thus, the occurrence of defect (e.g., crack) on the lateral surface of the lower semiconductor chip during subsequent fabrication processes may be minimized.

Accordingly, it may be possible to provide semiconductor packages having excellent reliability and methods of fabricating the same.

While example embodiments have been described with reference to the figures, it will be understood by those of ordinary skill in the art that various changes in form and details may be made therein without departing from the spirit and scope as defined by the following claims and their equivalents.

What is claimed is:

1. A semiconductor package, comprising:
a lower semiconductor chip;
a plurality of semiconductor chips stacked on the lower semiconductor chip in a first direction perpendicular to a top surface of the lower semiconductor chip;
a plurality of nonconductive layers between the plurality of semiconductor chips;
a nonconductive pattern that extends from the nonconductive layers and is on lateral surfaces of at least one of the plurality of semiconductor chips;
a first mold layer on a top surface of the nonconductive pattern; and
a second mold layer on a lateral surface of the nonconductive pattern and a lateral surface of the first mold layer,
wherein the nonconductive pattern and the first mold layer are between the second mold layer and lateral surfaces of the plurality of semiconductor chips, and
wherein the first mold layer and the second mold layer expose a top surface of an uppermost semiconductor chip among the plurality of semiconductor chips.

2. The semiconductor package of claim 1, wherein the first mold layer and the second mold layer contact each other while having an interface between the first mold layer and the second mold layer.

3. The semiconductor package of claim 1, wherein the nonconductive pattern includes a material the same as a material of the nonconductive layers.

4. The semiconductor package of claim 1, wherein the plurality of semiconductor chips and the nonconductive pattern are on the top surface of the lower semiconductor chip, and
wherein the nonconductive pattern is on a portion of the top surface of the lower semiconductor chip.

5. The semiconductor package of claim 4, wherein the second mold layer is on at least a portion of a lateral surface of the lower semiconductor chip.

6. The semiconductor package of claim 4, wherein the second mold layer extends onto a lateral surface of the lower semiconductor chip and is on an entirety of the lateral surface of the lower semiconductor chip.

7. The semiconductor package of claim 4, wherein the second mold layer extends onto a lateral surface of the lower semiconductor chip and exposes a portion of the lateral surface of the lower semiconductor chip.

8. The semiconductor package of claim 4, wherein the second mold layer is on the top surface of the lower semiconductor chip and exposes a lateral surface of the lower semiconductor chip.

9. The semiconductor package of claim 1, wherein the second mold layer has an inner surface and an outer surface that are opposite to each other, and
wherein the inner surface of the second mold layer is in contact with the lateral surface of the nonconductive pattern and with the lateral surface of the first mold layer.

10. The semiconductor package of claim 9, wherein the second mold layer extends onto a lateral surface of the lower semiconductor chip, and
wherein the inner surface of the second mold layer is in contact with the lateral surface of the lower semiconductor chip.

11. The semiconductor package of claim 9, wherein the outer surface of the second mold layer is aligned with at least a portion of a lateral surface of the lower semiconductor chip.

12. The semiconductor package of claim 1, wherein the plurality of semiconductor chips are memory chips, and
wherein the lower semiconductor chip is a logic chip.

13. A semiconductor package, comprising:
a lower semiconductor chip;
a plurality of semiconductor chips stacked on the lower semiconductor chip in a first direction perpendicular to a top surface of the lower semiconductor chip;
a plurality of bumps between the plurality of semiconductor chips and connecting the plurality of semiconductor chips to each other;
a plurality of nonconductive layers between the plurality of semiconductor chips, each of the plurality of nonconductive layers being between corresponding ones of the plurality of bumps and between neighboring ones of the plurality of semiconductor chips;
a nonconductive pattern that extends from the nonconductive layers and is on lateral surfaces of at least one of the plurality of semiconductor chips;
a first mold layer on a top surface of the nonconductive pattern; and a second mold layer on a lateral surface of the nonconductive pattern and a lateral surface of the first mold layer, wherein the nonconductive pattern and the first mold layer are between the second mold layer and lateral surfaces of the plurality of semiconductor chips, wherein each of the plurality of semiconductor chips includes a plurality of through electrodes, and wherein the plurality of semiconductor chips are connected to each other through the plurality of through electrodes and the plurality of bumps, and wherein the first mold layer and the second mold layer expose a top surface of an uppermost semiconductor chip among the plurality of semiconductor chips.

14. The semiconductor package of claim 13, wherein the plurality of semiconductor chips and the nonconductive pattern are on the top surface of the lower semiconductor chip, and wherein the nonconductive pattern is on a portion of the top surface of the lower semiconductor chip.

15. The semiconductor package of claim 14, wherein the second mold layer is on at least a portion of a lateral surface of the lower semiconductor chip.

16. The semiconductor package of claim 14, wherein the second mold layer is on the top surface of the lower semiconductor chip and exposes a lateral surface of the lower semiconductor chip.

17. The semiconductor package of claim 13, wherein a width of the lower semiconductor chip is greater than a width of each of the plurality of semiconductor chips in a second direction parallel to the top surface of the lower semiconductor chip.

18. The semiconductor package of claim 17, further comprising a plurality of additional bumps between the lower semiconductor chip and a lowermost semiconductor chip among the plurality of semiconductor chips, wherein the lower semiconductor chip comprises a plurality of lower through electrodes, and wherein the lower semiconductor chip is connected to the plurality of semiconductor chips through the plurality of lower through electrodes and the plurality of additional bumps.

19. The semiconductor package of claim 13, further comprising:

a first substrate; and an additional semiconductor chip on the first substrate, wherein the lower semiconductor chip is on the first substrate and horizontally spaced apart from the additional semiconductor chip, and wherein the second mold layer is vertically spaced apart from the first substrate.

* * * * *